(12) United States Patent
Inoue et al.

(10) Patent No.: US 7,745,860 B2
(45) Date of Patent: Jun. 29, 2010

(54) IMAGE SENSOR WITH EMBEDDED PHOTODIODE REGION AND MANUFACTURING METHOD FOR SAME

(75) Inventors: Tadao Inoue, Kawasaki (JP);
Katsuyoshi Yamamoto, Kawasaki (JP);
Narumi Ohkawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 508 days.

(21) Appl. No.: 11/852,663

(22) Filed: Sep. 10, 2007

(65) Prior Publication Data
US 2008/0001192 A1 Jan. 3, 2008

Related U.S. Application Data

(63) Continuation of application No. PCT/JP2005/004322, filed on Mar. 11, 2005.

(51) Int. Cl.
*H01L 31/113* (2006.01)
(52) U.S. Cl. .............. 257/292; 257/E27.131; 438/48
(58) Field of Classification Search ........... 257/291, 257/292, E27.131, E27.132, E27.133, E25.032; 438/30, 59, 48, 87, 200
See application file for complete search history.

(56) References Cited

U.S. PATENT DOCUMENTS

| 6,180,969 B1 | 1/2001 | Yang et al. |
| 6,433,373 B1 | 8/2002 | Lee et al. |
| 6,756,616 B2 * | 6/2004 | Rhodes ................ 257/291 |
| 6,881,992 B2 * | 4/2005 | Lee et al. ............. 257/292 |
| 2003/0096443 A1 | 5/2003 | Hwang |

FOREIGN PATENT DOCUMENTS

| JP | 11317512 A | 11/1999 |
| JP | 20002016243 A | 1/2002 |
| JP | 2003282857 A | 10/2003 |
| KR | 10-2006-0010902 A | 2/2006 |

OTHER PUBLICATIONS

International Search Report of PCT/JP2005/004322, date of mailing Jun. 21, 2005.
Korean Office Action dated Oct. 28, 2008 (mailing date), issued in corresponding Korean Patent Application No. 10-2007-7020381.

* cited by examiner

*Primary Examiner*—Thomas L Dickey
*Assistant Examiner*—Fazli Erdem
(74) *Attorney, Agent, or Firm*—Westerman, Hattori, Daniels & Adrian, LLP

(57) ABSTRACT

A CMOS image sensor with an effectively increased aperture ratio and moreover with improved optical sensitivity, and a method of manufacture of such a CMOS image sensor is provided a first aspect of the invention is an image sensor, has a pixel region 10 in which are formed a plurality of pixels each having at least a photodiode, a reset transistor, and a source-follower transistor; and a peripheral circuit region 12 in which are formed peripheral circuits which process read-out signals read out from the pixel region, a well region PW2 in the pixel region PW1 is formed to be more shallow than a well region in the peripheral circuit region. Also, reset transistors or source-follower transistors are formed in the shallow well region PW2 of the pixel region 10, and a photodiode region PHD2 is embedded below the transistor well region PW2.

14 Claims, 30 Drawing Sheets

OVERALL CONFIGURATION OF IMAGE SENSOR

FIG. 9 OVERALL CONFIGURATION OF IMAGE SENSOR

FIG. 10
PROCESS (1)
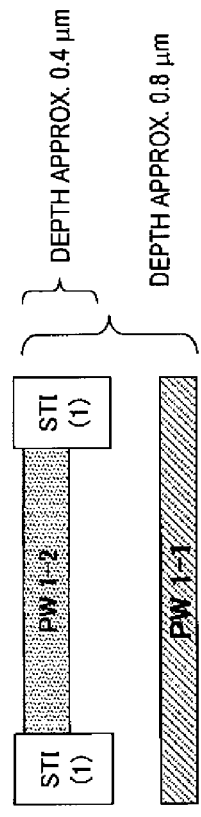
- PERIPHERAL CIRCUIT Nch
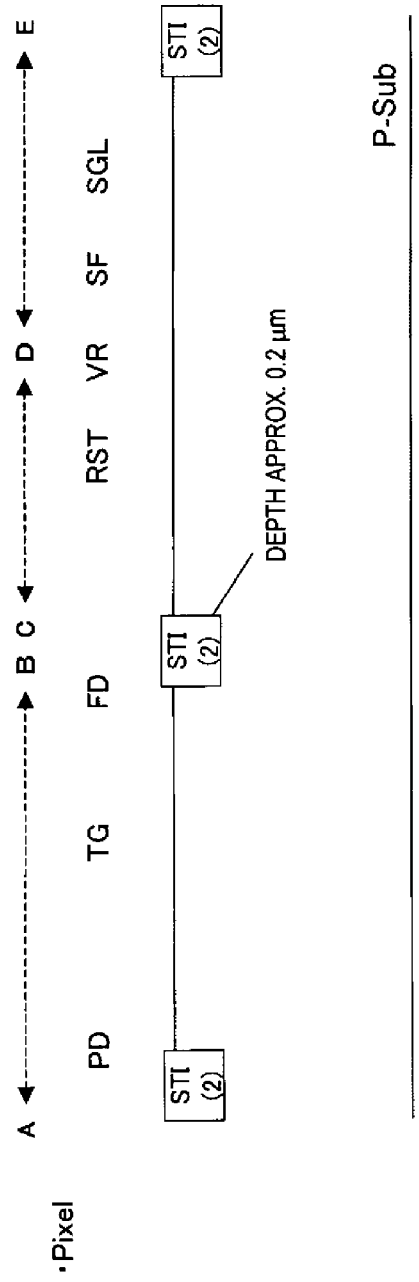
- Pixel

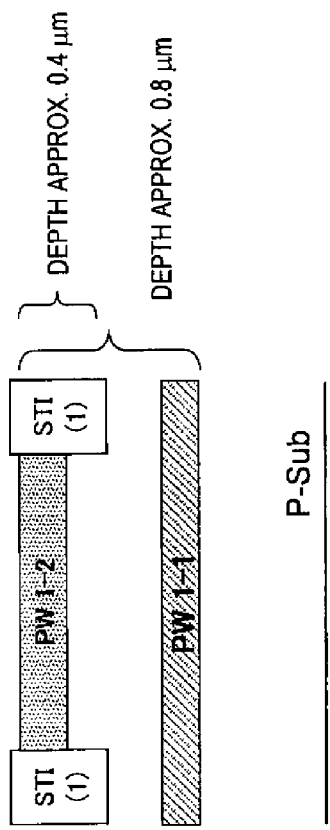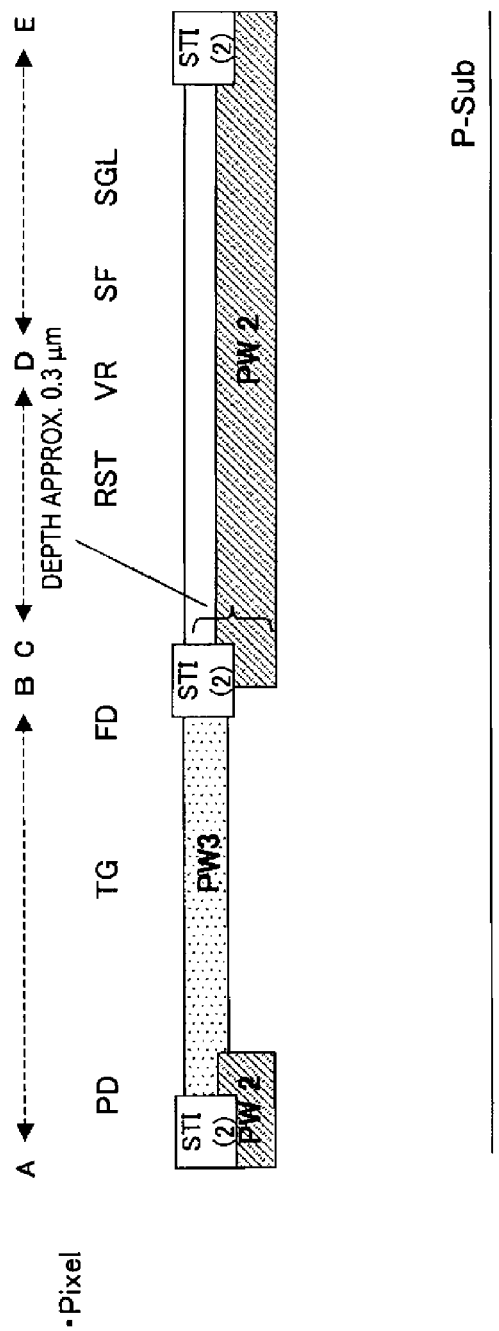
FIG.11

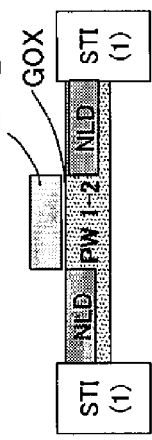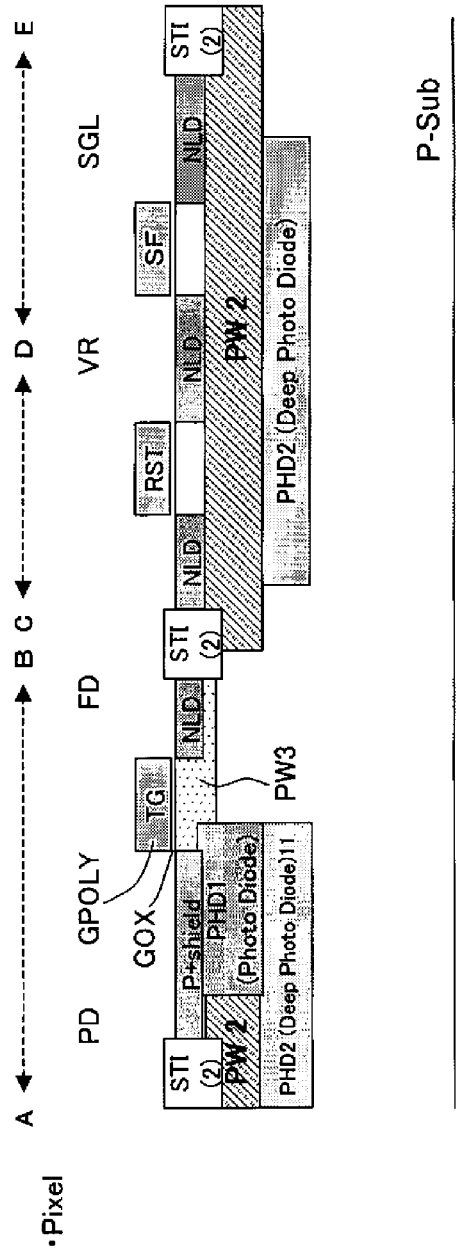
FIG. 13

FIG.15 PROCESS (6)
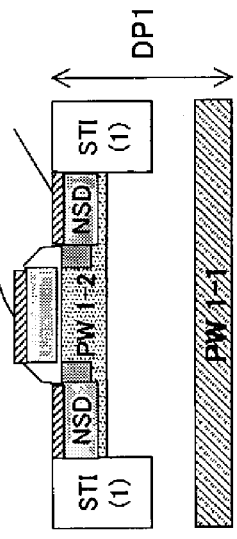
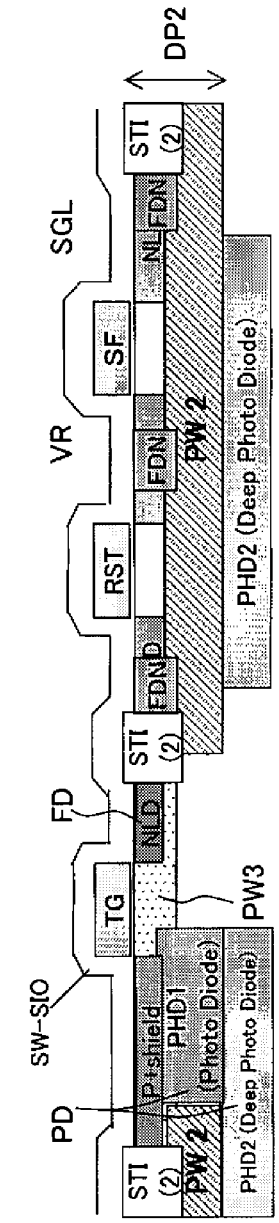

FIG.16
PROCESS (7)
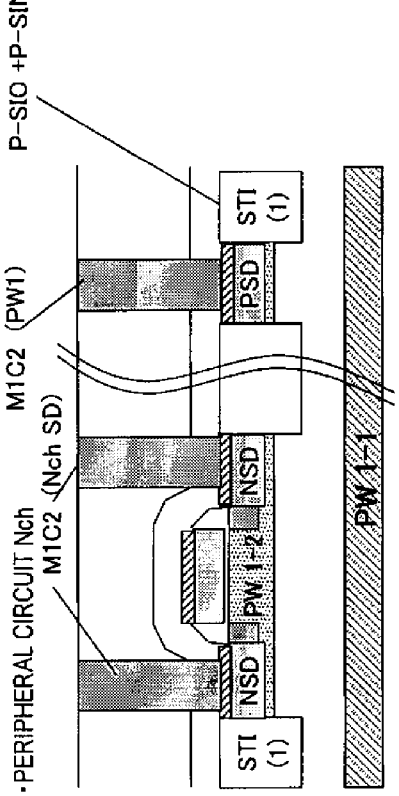
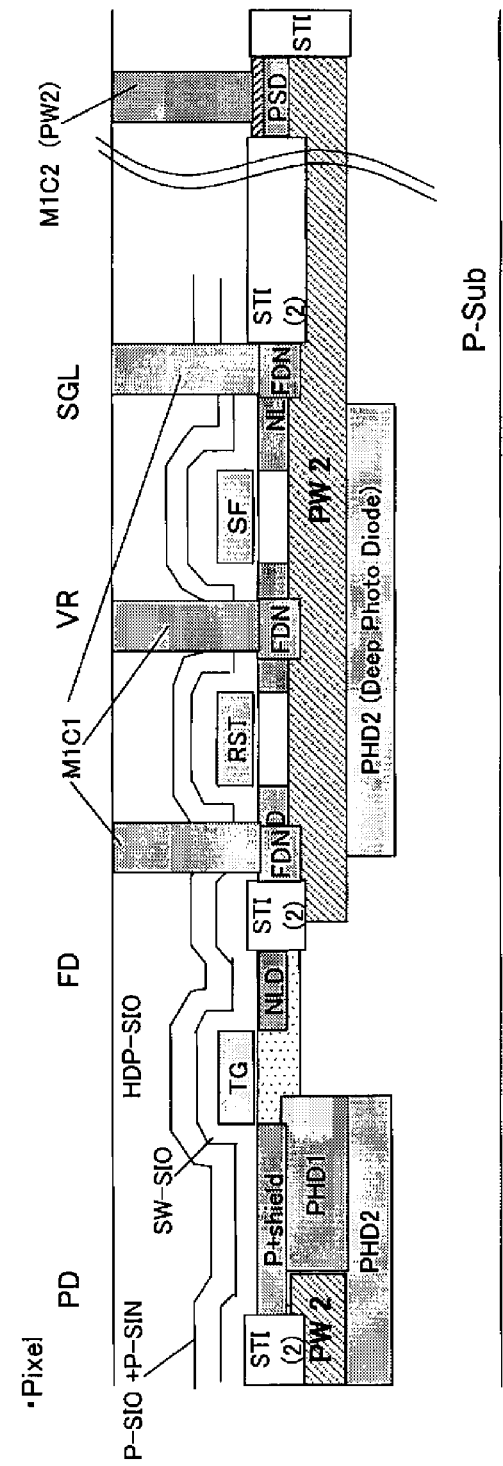

FIG. 17 PROCESS (8)

FIG.22 SECOND EMBODIMENT

FIG.24
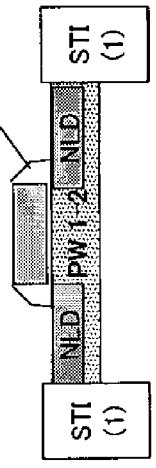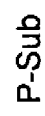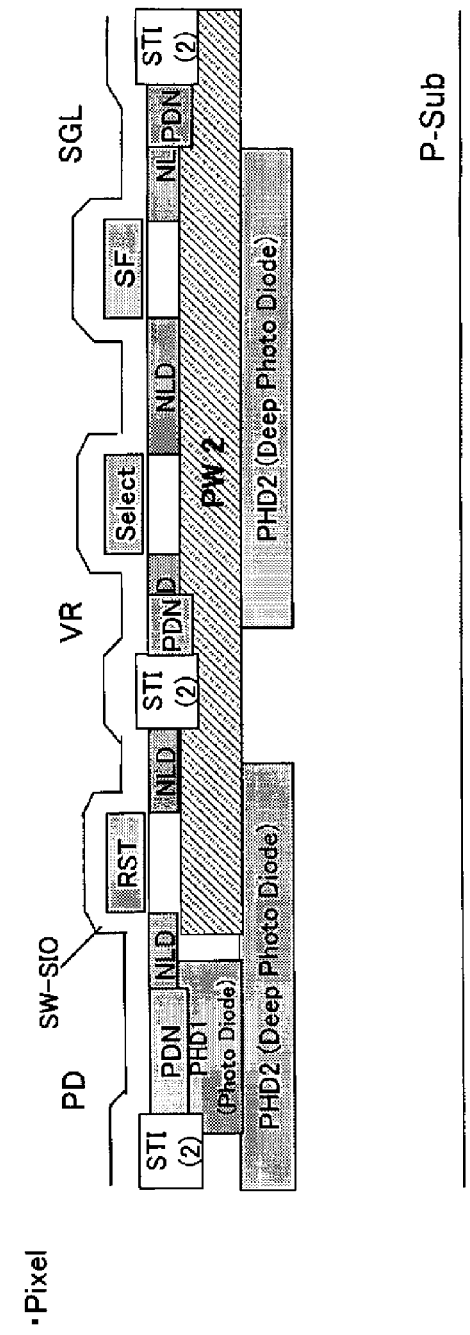

IMAGE SENSOR WITH EMBEDDED PHOTODIODE REGION AND MANUFACTURING METHOD FOR SAME

CROSS REFERENCE TO RELATED APPLICATIONS

This application is a continuation of International Application No. PCT/JP2005/4322, filed on Mar. 11, 2005, now pending, herein incorporated by reference.

TECHNICAL FIELD

The present embodiment relates to an image sensor with an embedded photodiode region and to a manufacturing method for such an image sensor, and in particular relates to an image sensor with a photodiode region embedded extending to below the transistor formation region, and to a manufacturing method for such an image sensor.

BACKGROUND ART

Image sensors include CCDs (Charge Coupled Devices) and APSes (Active Pixel Sensors); CMOS image sensors are a representative example of APSes. CCDs are used in video cameras and other devices, and CMOS image sensors are used in inexpensive digital still cameras and other devices. Of the two, CMOS image sensors can be manufactured using CMOS processes and so have low manufacturing costs, and have lower power consumption compared with CCD image sensors, and so are used in portable telephones, portable information terminals, and other battery-driven devices.

CMOS image sensors have a photodiode as a photoelectric conversion element, read out the amount of electric charge accumulated on the photodiode by using a source-follower transistor or similar and capture, the incident light intensity is captured as an electrical signal. CMOS image sensors which have already been commercialized are three-transistor type devices comprising a photodiode, a reset transistor, a source-follower transistor, and a selector transistor. In addition, recently a four-transistor type APS has been proposed, in which a transfer gate transistor is provided between the photodiode and the reset transistor.

Three-transistor type and four-transistor type APSes are for example described in Patent Document 1 (Japanese Patent Laid-open No. 2002-16243 (published Jan. 18, 2002)).

In a four-transistor type APS, a floating diffusion (FD) region, comprising a floating diffusion layer, is provided at the point of contact between the transfer gate transistor and the reset transistor. And, after placing this floating diffusion region at the reset level of the reset transistor, the transfer gate transistor is made conducting, so that charge accumulated in the photodiode region is transferred to the floating diffusion region to cause the potential thereof to change, and this change in potential is captured in a signal line via the source-follower transistor. By detecting the difference between the potential in the floating diffusion region at the time of reset and at the time charge is transferred from the photodiode, a signal with noise eliminated can be captured.

Further, a five-transistor type APS has been proposed, with an overflow drain transistor added in order to prevent photodiode overflow. By controlling the overflow drain transistor, the accumulation start time of the photodiode can be controlled, and a global shutter design can be adopted.

As the number of transistors within pixels increases in this way to accompany enhanced performance, the area ratio of the photodiode region to the pixel area decreases, leading to a decrease in the so-called aperture ratio. In order to alleviate this problem, common use of transistors and other elements by adjacent pixels has been proposed. However, in the case of a four-transistor type APS, three transistors are used in common between adjacent pixels, and so the layout of each pixel is not completely the same, and the unevenness in optical sensitivity among pixels is increased, leading to a decline in image quality.

Further, in order to prevent a decline in aperture ratio, a configuration has been proposed in which the photodiode region is embedded below the transistor formation region within pixels. For example, such a method is disclosed in Patent Document 1.

FIG. 1 is a cross-sectional view of a CMOS image sensor described in Patent Document 1. At a P-type epitaxial layer 52 formed on the P-type semiconductor substrate 51 are formed the gate electrode 55 of a transfer gate transistor TG, the gate electrode 58 of a reset transistor, and the gate electrode 61 of a source-follower transistor, with gate oxide films 56, 63, 61 intervening; on either side of these gate electrodes are provided source and drain regions 57, 59, 60, 62. A high-density N-type photodiode region 53 is formed in the depth direction from the surface of the epitaxial layer 52, and this photodiode region 53 is embedded so as to be extended below the transfer gate transistor, reset transistor, and source-follower transistor. The photodiode region 53 is embedded and isolated from the insulating film 54 at the surface by a high-density P+ region formed at the surface of the epitaxial layer 52, so that the dark current due to a leakage current from this insulating film 54 can be suppressed.

In this way, in the CMOS image sensor described in Patent Document 1, by embedding the photodiode region in superposition below the transistor formation region within a cell, reduction of the aperture ratio can be prevented, and photo-sensitivity is enhanced.

SUMMARY

It is an aspect of the embodiments discussed herein to provide an image sensor, having: a pixel region in which are formed a plurality of pixels each having at least a photodiode, a reset transistor, and a source-follower transistor; and a peripheral circuit region in which are formed peripheral circuits which process read-out signals read out from the pixel region, a well region in the pixel region is formed to be more shallow than a well region in the peripheral circuit region. Also, reset transistors or source-follower transistors are formed in the shallow well region of the pixel region, and a photodiode region is embedded below the transistor well region

BRIEF DESCRIPTION OF THE DRAWINGS

FIG. 10 is a cross-sectional view showing a manufacturing process in the first embodiment;

FIG. 11 is a cross-sectional view showing a manufacturing process in the first embodiment;

FIG. 13 is a cross-sectional view showing a manufacturing process in the first embodiment;

FIG. 15 is a cross-sectional view showing a manufacturing process in the first embodiment;

FIG. 16 is a cross-sectional view showing a manufacturing process in the first embodiment;

FIG. 24 is a cross-sectional view showing a manufacturing process in the second embodiment;

DETAILED DESCRIPTION OF THE EMBODIMENTS

Figure 1:
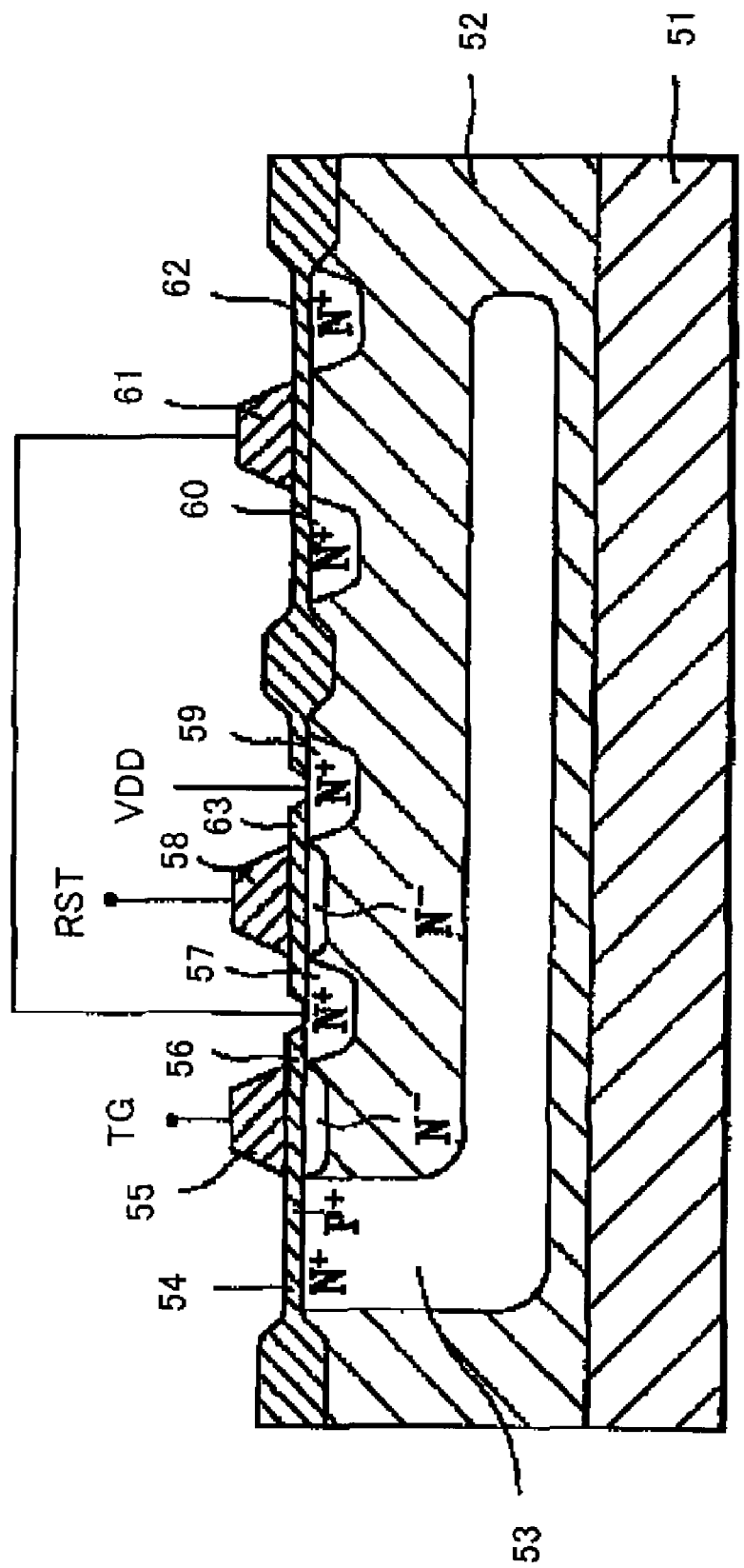
FIG. 1 is a cross-sectional view of the CMOS image sensor described in Patent Document 1.

The CMOS image sensor described in Patent Document 1 has an N-type photodiode region 53 embedded below the entire region of the transistor formation region within the pixel. This buried photodiode region 53 extends into a deep region of the epitaxial layer 52, and so light incident from the surface is attenuated prior to reaching the photodiode region 53 buried in the deep region, and the buried region 53 cannot adequately contribute to improve sensitivity.

Further, the N-type photodiode region 53 is formed directly below the transfer gate transistor TG and floating diffusion region 57, and so is an obstacle to attempts to keep low the threshold voltage Vth of the transfer gate transistor TG, and in addition increases the junction capacitance of the floating diffusion region 57. That is, in order to electrically separate the embedded N-type photodiode region 53 from the surface N-type source-drain region, a high impurity concentration of the P-type epitaxial layer 52 between the two is necessary. By means of this high-concentration P-type epitaxial layer, the channel region concentration in the transfer gate transistor is increased, and the threshold voltage is raised. When the threshold voltage of the transfer gate transistor is raised, the efficiency of charge transfer from the photodiode region 53 to the floating diffusion region 57 is reduced, leading to a decline in sensitivity. Because of the high concentration in the P-type epitaxial layer 52 at which the N-type floating diffusion region 57 is formed, the junction capacitance of the floating diffusion region 57 is increased. Due to the larger junction capacitance, the voltage changes at the floating diffusion region as a proportion of the charge transferred from the photodiode region 53 is decreased, leading to a decline in sensitivity.

Hence an object of this embodiment is to provide a CMOS image sensor with an effectively increased aperture ratio and moreover with improved optical sensitivity, and a method of manufacture of such a CMOS image sensor.

Below, embodiments are explained referring to the drawings. However, the technical scope of the embodiment is not limited to these embodiments, but extends to the embodiments described in the Scope of Claims and to inventions equivalent thereto.

Figure 2:
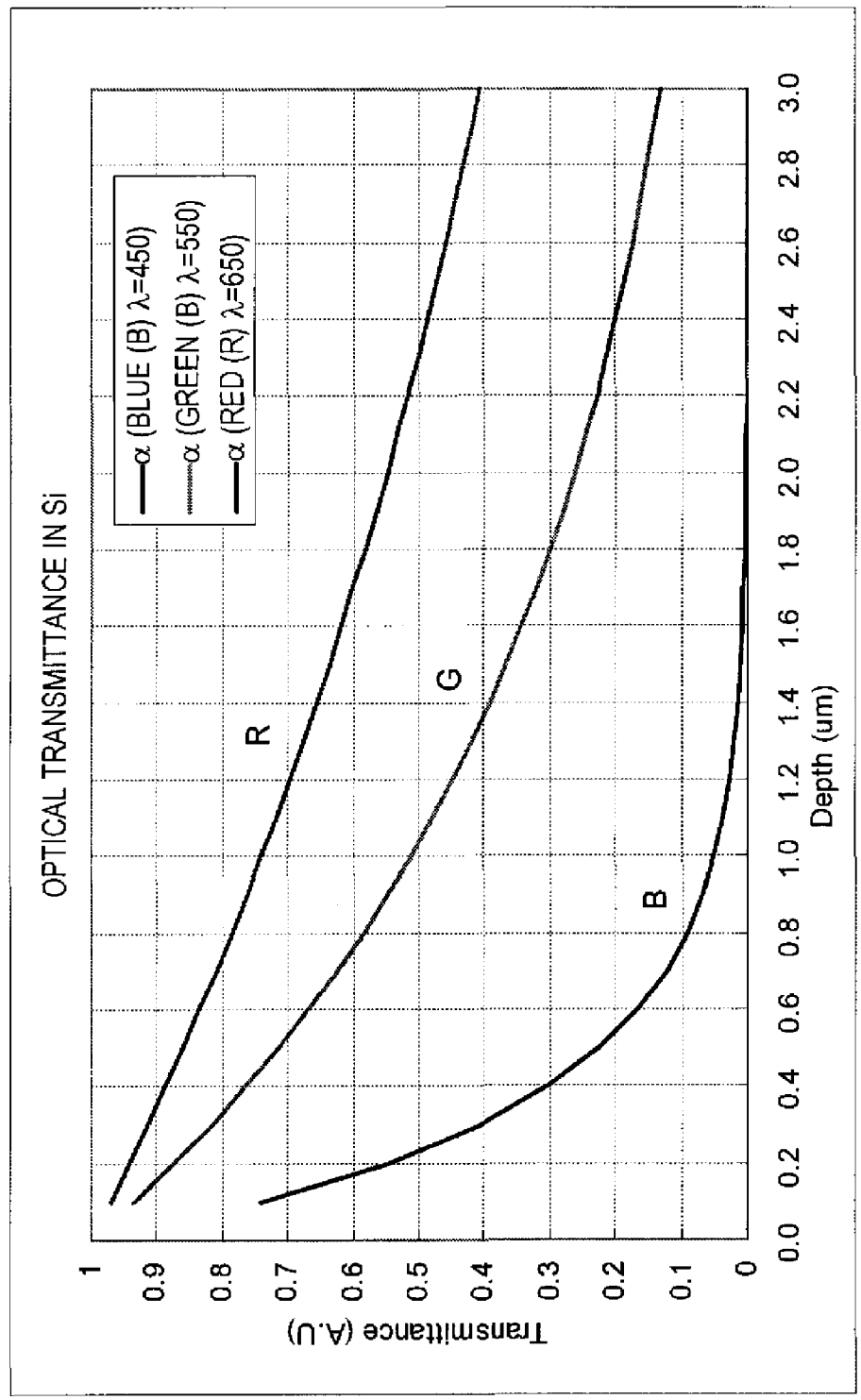
FIG. 2 is a graph showing the optical transmittance in silicon substrate.

FIG. 2 is a graph showing the optical transmittance in silicon substrate. The horizontal axis indicates the substrate depth ($\mu$m), and the vertical axis indicates the optical transmittance (A.U.). Of the three primary colors which are red (R), green (G) and blue (B), blue (B) light, with the shortest wavelength, is considerably attenuated because numerous photons undergo photoelectric conversion in the shallow region of the substrate, so that the optical transmittance falls rapidly on moving deeper into the substrate. Green G and red R light, at longer wavelengths, also undergo photoelectric conversion in the shallow region of the substrate, and the optical transmittance declines on moving deeper into the substrate. Although not clear from the graph of FIG. 2, the transmittance attenuates exponentially with depth in the substrate for red R and green G, similarly to blue B, and in deep regions in the substrate the amounts of red R and green G light are also attenuated, and the photoelectric conversion efficiency is low. That is, incident light is rapidly attenuated in shallow regions in the substrate.

As is seen from the optical transmittance in silicon substrate, in order to improve optical sensitivity of CMOS image sensor, it is important to capture charges photoelectric converted from light incident from the substrate surface in a shallow region as close to the substrate surface as possible. Hence when adopting a structure in which the photodiode region is embedded in the substrate, it is desirable that the photodiode region be formed in as shallow a region as possible.

Prior to explaining the configuration and method of manufacture of the CMOS image sensor of this embodiment, four-transistor type, shared four-transistor type, pseudo-four-transistor type, and three-transistor type CMOS image sensors are explained.

Figure 3:
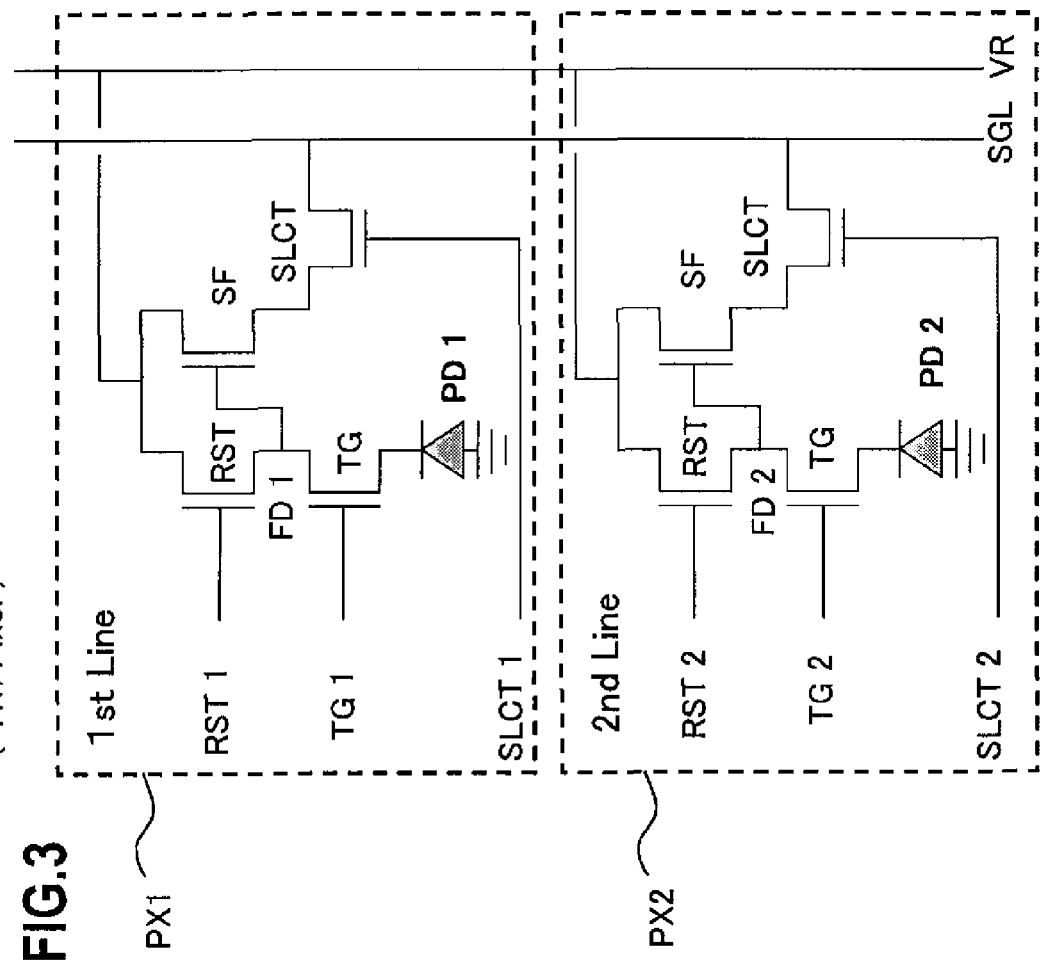
FIG. 3 is a circuit diagram of a four-transistor type APS.

FIG. 3 is the circuit diagram of a four-transistor-type APS. In FIG. 3, two pixels PX1 and PX2, positioned in two rows and one column, are shown. The pixels PX1 and PX2 comprise photodiodes PD1 and PD2 and four transistors each. The four transistors are a reset transistor RST, connected to a reset voltage VR; a source-follower transistor SF, also connected to the reset voltage VR; a selector transistor SLCT, between the source-follower transistor SF and signal line SGL; and a transfer gate transistor TG, provided between the reset transistor RST and photodiode PD. The transfer gate transistor TG is connected to the cathode side of the photodiode PD. The nodes connecting the reset transistors RST and transfer gate transistors TG are floating diffusion regions FD1 and FD2, connected to the gates of the source-follower transistors SF.

Figure 4:
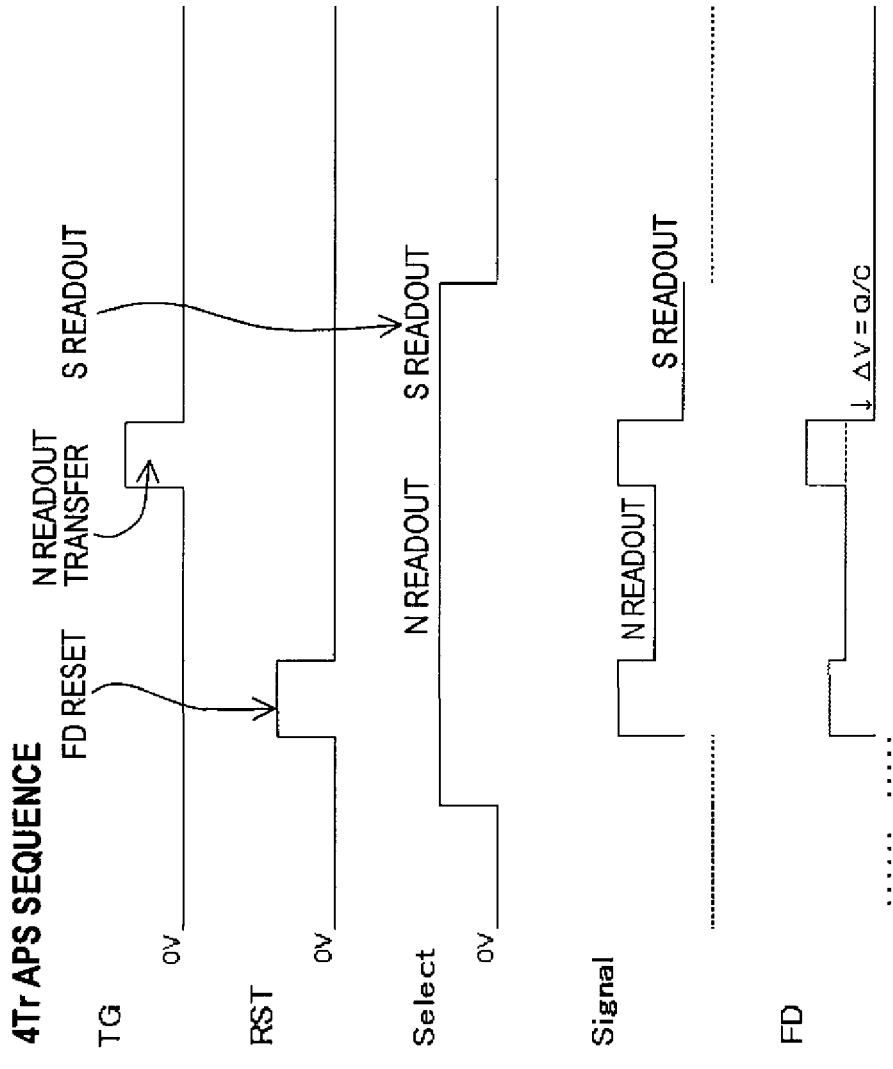
FIG. 4 is an operation waveform diagram of a four-transistor type APS.

FIG. 4 is an operation waveform of a four-transistor type APS. A case is explained in which pixel PX1 is selected. First, with the selection line SLCT1 (Select in FIG. 4) driven to H level to cause the selector transistor SLCT to be conducting, the reset line RST1 is driven to H level to cause the reset transistor RST to conduct, and the floating diffusion region FD1 is reset to the reset voltage level VR. This reset level is output, as a noise signal, to the signal line SGL (Signal in FIG. 4) via the source-follower transistor SF and selector transistor SLCT. Thereafter, when the transfer gate transistor TG is made conducting, charge comprising electrons accumulated on the cathode of the photodiode FD is transferred to the floating diffusion region FD1, and the voltage of the floating diffusion region FD declines. This decline in voltage ΔV is equal to the amount of transferred charge Q divided by the parasitic capacitance C of the floating diffusion region FD. The level of the declined floating diffusion region FD is output to the signal line SGL as a detection signal. An output circuit, not shown, detects the level difference ΔV between the aforementioned noise signal and the detection signal, and outputs the level difference as a pixel light intensity signal.

In this way, in order to increase the detected light intensity signal ΔV, it is necessary that the amount of light incident on the photodiode be increased, that the photoelectric conversion efficiency be raised, and that the parasitic capacitance C of the floating diffusion region FD be reduced.

Figure 5:
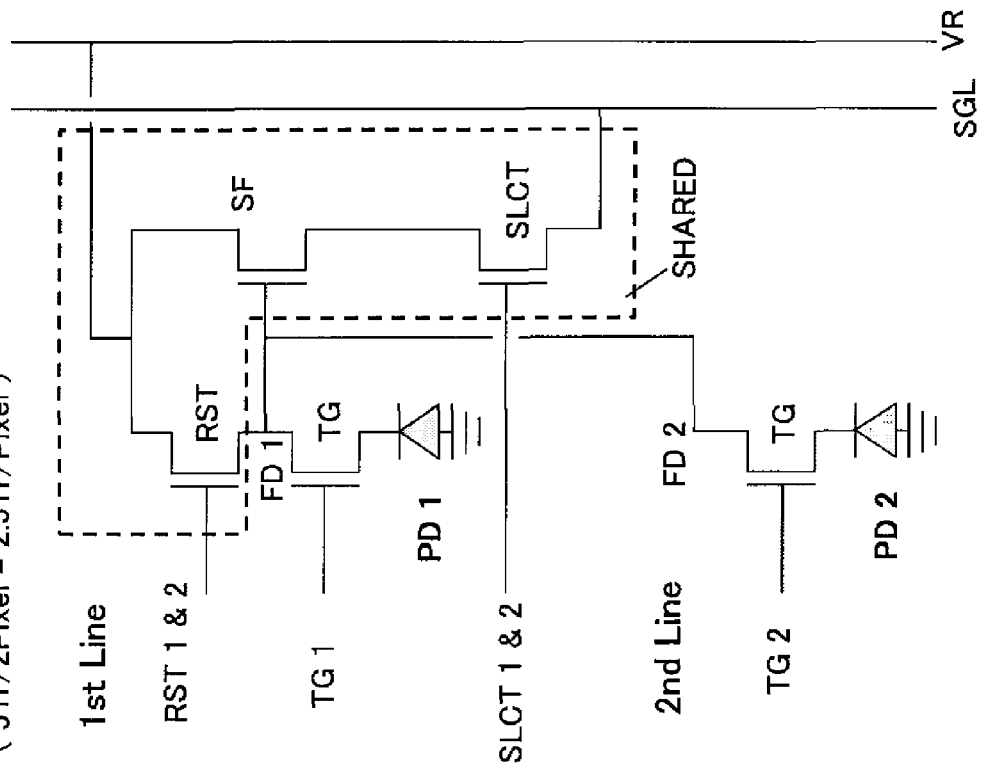
FIG. 5 is a circuit diagram of a shared four-transistor type APS.

FIG. 5 is a circuit diagram of a shared four-transistor type APS. In the four-transistor type APS shown in FIG. 3, four transistors are provided in each pixel. As a result, the aperture ratio, which is the ratio of the area in which the photodiode is formed to the pixel area, is lowered. In order to resolve this problem, in the sensor of FIG. 5, a reset transistor RST, source-follower transistor SF, and selector transistor SCLT are shared by adjacent pixels. If these three transistors are formed in the shared area SHARED, then it is sufficient to provide only five transistors for every two pixels, or 2.5 transistors per pixel, so that the decrease in aperture ratio can be suppressed.

The operation of this shared four-transistor type APS is similar to that in FIG. 4; while the selector transistor SLCT being in the conducting state, the floating diffusion regions FD1, FD2 are reset by the reset transistor RST, in this state the noise signal is read out, and thereafter the transfer gate signal TG1 causes the transfer gate transistor TG on the side of the photodiode FD1 to be conducting, and a detection signal is read out. In order to read out the signal of another pixel, the same operation as above is repeated. That is, in reading out the signals for each pixel, the shared three transistors are each utilized.

Figure 6:
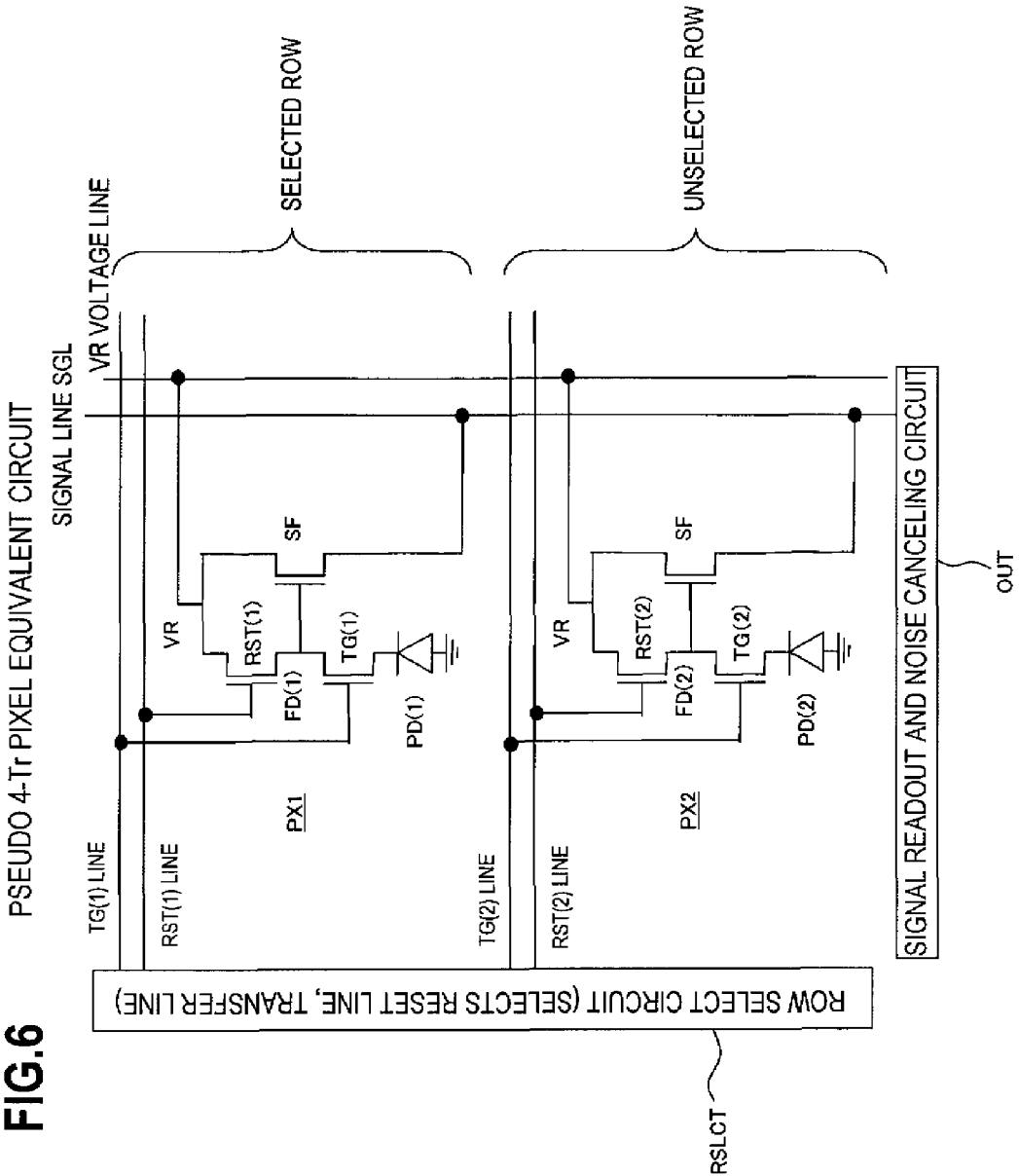
FIG. 6 is a circuit diagram of a pseudo-four-transistor type APS.

FIG. 6 is a circuit diagram of a pseudo-four-transistor type APS. The pixels PX1 and PX2 of the pseudo-four-transistor type APS comprise a photodiode PD and three transistors RST, TG, SF; the selector transistor SLCT of the four-transistor type device shown in FIG. 3 is not provided. That is, the source terminal of the source-follower transistor SF is directly connected to the signal line SGL. Instead, modifications are made to control of the reset voltage VR and the reset transistor RST, to effectively realize the same row-selection function as that of the selector transistor.

Figure 7:
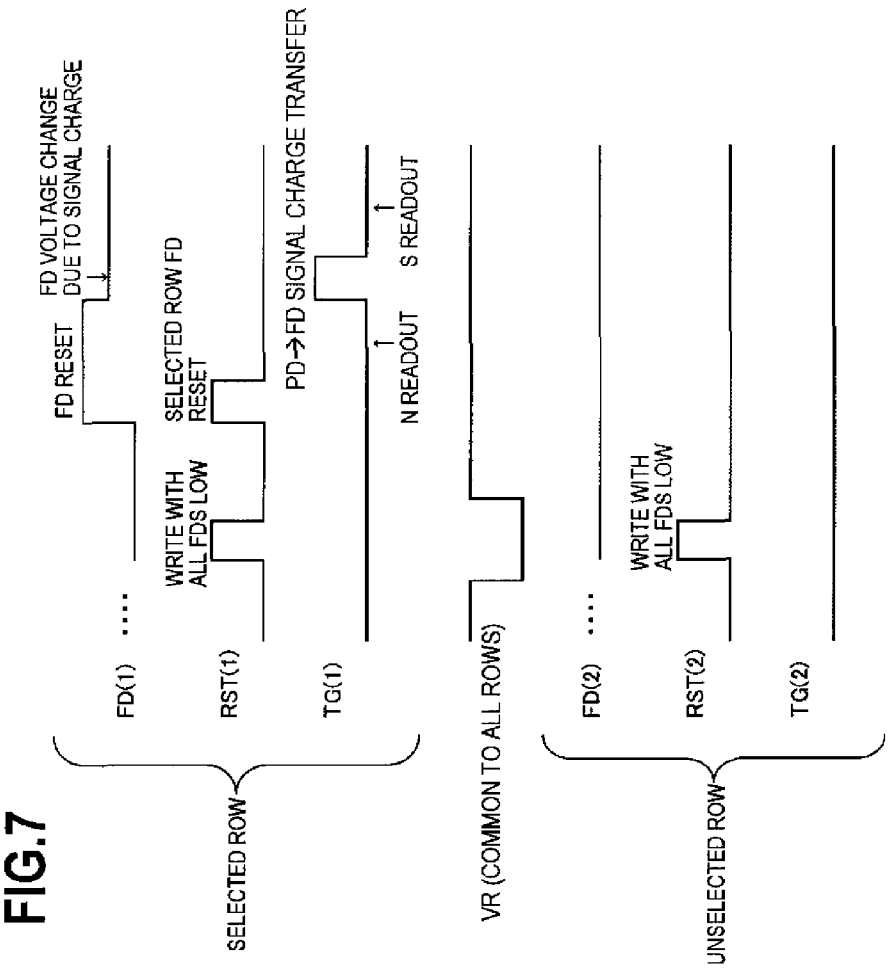
FIG. 7 is an operation waveform diagram of a pseudo-four-transistor type APS.

FIG. 7 is an operation waveform diagram of a pseudo-four-transistor type APS. First, as the row selection operation, with the reset voltage VR at L level, all reset lines are driven to H level to cause the reset transistors RST for all pixels to be conducting, and the floating diffusion regions FD for all pixels are set to L level. Thereafter, the reset voltage VR is returned to H level, the reset line of the selected row is driven to H level, and the reset transistors RST of pixels belonging to the selected row are made conducting, setting only the floating diffusion region FD(1) to the reset level. This state is read out from the signal line SGL as a noise signal. At this time, the floating diffusion region FD(2) of the unselected row is at L level, and the source-follower transistor SF(2) has no effect on the signal line SGL. Then, the transfer gate line of the selected row is driven to H level, causing the transfer gate transistor TG(1) to be conducting, the charge on the photodiode PD(1) is transferred to the floating diffusion region FD(1), and the detection signal is read out from the signal line SGL. At this time also, the source-follower transistor SF(2) in the unselected row has no effect on the signal line SGL.

Thus in a pseudo-four-transistor type APS, even when a selector transistor is not provided, an unselected row can be prevented from affecting the signal line SGL through standby operation of the reset voltage VR and reset transistors, and effective row selection is possible.

Figure 8:
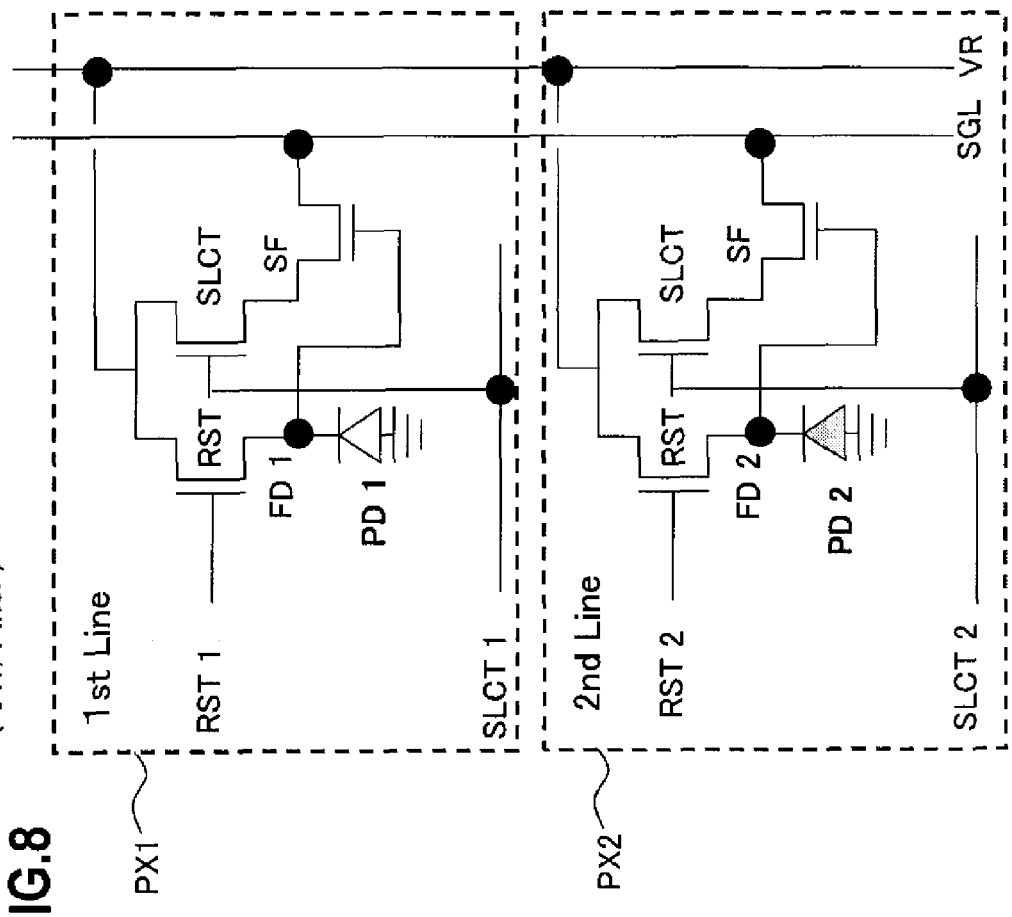
FIG. 8 is a circuit diagram of a three-transistor type APS.

FIG. 8 is a circuit diagram of a three-transistor type APS. The pixels PX1 and PX2 each comprise a photodiode PD, reset transistor RST, selector transistor SLCT, and source-following transistor SF. The floating diffusion regions FD are cathode electrodes of the photodiodes PD. However, the selector transistor SLCT and source-follower transistor SF may have opposite connections.

In this three-transistor type APS, initially the reset transistors RST are made conducting and set the floating diffusion regions FD to the reset level; thereafter, as a result of electrons generated at the cathode of the photodiode PD due to reception of light during an integrating period, the level of the floating diffusion region FD drops, and a signal indicating this drop is read out from the signal line SGL as a detection signal.

First Embodiment

Figure 9:
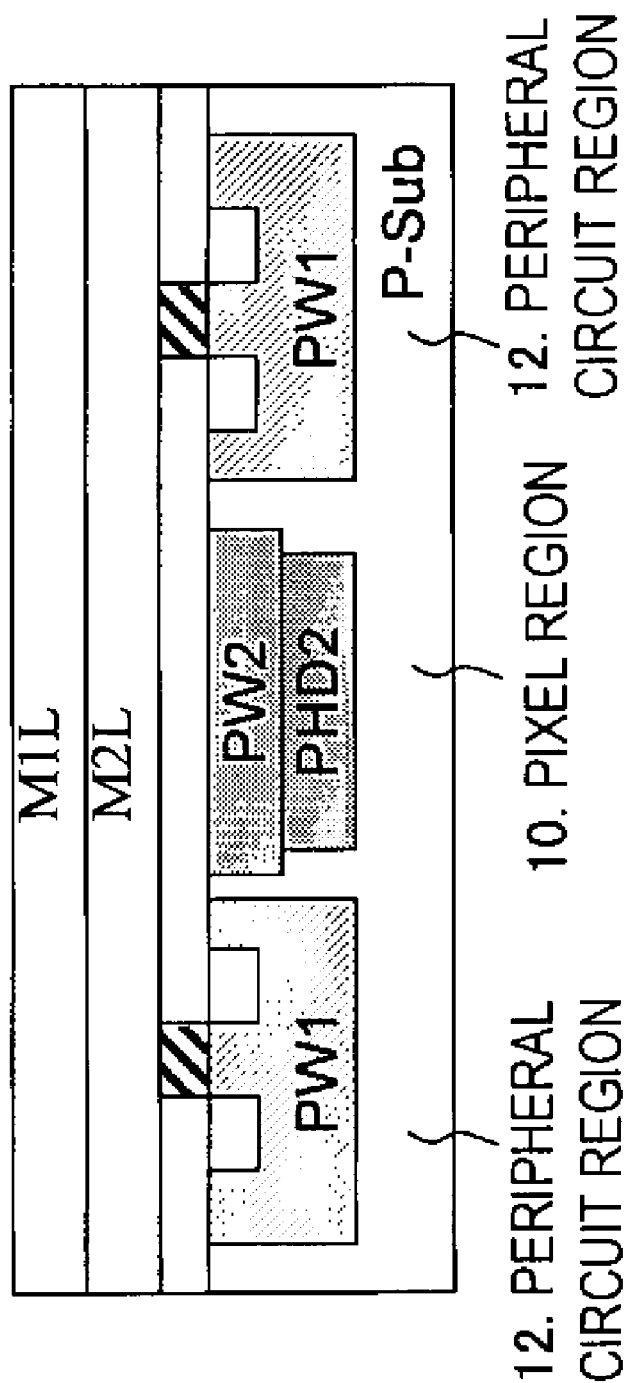
FIG. 9 is a cross-sectional view showing the overall configuration of the image sensor in a first embodiment.

Below, the structure and method of manufacture of the CMOS image sensor of a first embodiment are explained. FIG. 9 is a cross-sectional view showing the overall configuration of the image sensor of this aspect. This image sensor is provided with a pixel region 10 having a plurality of pixels in the center portion of a P-type silicon substrate P-sub; on the perimeter thereof is provided a peripheral circuit region 12, comprising an output circuit which processes signals read out from pixels, a driving circuit which drives reset lines and transfer gate lines, and similar. In the peripheral circuit region 12 is formed a transistor source-drain region comprised by peripheral circuits within a first P-type well region PW1. On the other hand, in the pixel region 10 is formed a second P-type well region PW2 which is more shallow than the first P-type well region PW1, and therewithin are formed source-drain regions in pixels. In the pixel region 10, an N-type photodiode region PHD2 is embedded below the second P-type well region PW2.

By forming the P-type well region PW2 of the pixel region 10 to be shallower than the P-type well region PW1 of the peripheral circuit region 12, the photodiode region PHD2 embedded therebelow can be formed in a shallow region, and so electrons generated in a shallow region, at which incident light is not greatly attenuated, can be captured in the embedded photodiode region PHD2.

Also, although not shown, an element separation structure in the pixel region 10 is formed to be more shallow than the element separation structure of the peripheral circuit region 12. Within the pixel region 10, N-channel transistors are primarily formed, whereas in the peripheral circuit region 12, P-channel and N-channel transistors forming CMOS circuits are formed. Hence in the peripheral circuit region, an element separation structure having a certain depth is necessary for the CMOS configuration, but in the pixel region the element separation structure need not be as deep. Thus the element separation structure in the pixel region can be formed to be shallow, and as a result the N-type photodiode region can be formed in the shallow region therebelow.

FIG. 10 through FIG. 17 are cross-sectional views showing each of the processes (1) through (8) of the method of manufacture of the first embodiment. FIG. 18 through FIG. 21 are pixel layout diagrams. First, the configuration of the CMOS image sensor of the first embodiment is explained referring to the cross-sectional view of FIG. 15 and the pixel layout diagram of FIG. 18. In this embodiment, pixels are the pseudo-four-transistor type APS devices explained in FIG. 6; constituent elements are a photodiode PD, transfer gate transistor TG, floating diffusion region FD, reset transistor RST, and source-follower transistor SF. The reset transistor RST and source-follower transistor SF are connected to the reset voltage VR, and the source-follower transistor SF is connected to the signal line SGL.

In FIG. 15, similarly to other process cross-sectional views, the pixel cross-sectional structure and the peripheral circuitry cross-sectional structure are shown separately. And, the pixel cross-section in FIG. 15 corresponds to the A-B and C-D-E cross-sections indicated by dashed lines in the layout diagram of FIG. 18. In the layout diagram of FIG. 18, an active region separated by a separation trench (element separation structure) comprised by Shallow Trench Isolation (STI), gate polysilicon constructing gate electrodes of the three transistors TG, RST, and SF, and contact vias formed in the active region and gate electrodes, are shown. The pattern of the active region, gate polysilicon, and contact vias appears on the bottom-right in the drawing. In the layout diagram of FIG. 18, the symbols TG, RST, SF are assigned to three transistor gate electrode positions in the pixel region Pixel, and the floating diffusion region FD and reset voltage VR in the active region are indicated.

In the cross-sectional view of FIG. 15, an N-channel transistor configuration is shown as the cross-sectional structure of the peripheral circuitry, and a deep P-type impurity-doped region PW1-1 and shallow P-type impurity-doped region PW1-2, forming the first P-type well region PW1, are formed within the P-type silicon substrate P-sub. Hence the first P-type well region PW1 in the peripheral circuit region is formed to a depth DP1. And, in the cross-sectional structure of the peripheral circuitry, the separation trenches STI(1) which separate transistors are formed comparatively deeply. Thus in the peripheral circuit region, by forming a deep P-type well region PW1, the N-type transistors formed therein can be provided with a structure enabling high speed operation. That is, by forming the deep P-type well region PW1, the impurity concentration of the substrate surface portion of the P-type well region PW1 can be lowered, and the junction capacitance of the transistor source-drain regions can be made small. By this means, high speed transistor operation is made possible.

In the parasitic PNPN structure which is characteristic of CMOS structures, by raising the impurity concentration in the deep region of the first P-type well region PW1, voltage increase due to the substrate current flowing through the well region can be suppressed, so that latch-up of the parasitic PNPN structure can be suppressed. A parasitic PNPN structure comprises, for example, a P-type source-drain region in the N well region of a P channel transistor, not shown, an N well region, the P well region of FIG. 15, and the N-type source-drain region therein.

As explained above, it is not preferable that in the peripheral circuit region the first well region PW1 be formed to be shallow, and the optimum value for the depth is desirable.

On the other hand, in the pixel cross-sectional structure, a second P-type well region PW2 of depth DP2 shallower than the first P-type well region PW1 is formed, and within this second P-type well region PW2, the source-drain regions of the transfer gate transistor TG, reset transistor RST, and source-follower transistor SF are formed. These transistors are all N channel transistors. With the shallow P-type well region PW2, separation trenches STI(2) which separates the transistors are also formed, to a more shallow depth than the separation trench STI(1) of the peripheral circuit region.

In the pixel region, a first N-type impurity-doped region PHD1 and a deeper second N-type impurity-doped region PHD2, forming the photodiode region PD, are formed. The first photodiode region PHD1 is formed in the vicinity of the gate of the transfer gate transistor TG; the second photodiode region PHD2 is formed in the region below the first photodiode region PHD1 and in the region below the second P-well region PW2. That is, the second photodiode region PHD2 is buried extending below the reset transistor RST and source-follower transistor SF in the pixel. By this means, the area of the photodiode region can be increased in plane view, resulting in an improved aperture ratio.

The transfer gate transistor TG and floating diffusion region FD are formed within a third P-type well region PW3, which is still shallower than the second P-type well region PW2. Further, the second photodiode region PHD2 is not formed below the floating diffusion region FD and gate region of the transfer gate transistor TG. The reason for this is as follows. If the shallow second photodiode region PHD2 is formed below the FD region and TG gate, then the N-type region FD and the N-type second photodiode region PHD2 must be electrically separated, and to this end, the impurity concentration of the P-type well region PW3 must be raised. However, if the impurity concentration of the P-type well region PW3 is raised, the junction capacitance of the floating diffusion region FD is increased, and moreover the threshold voltage of the transfer gate transistor TG is increased. An increase in the junction capacitance of the floating diffusion region FD means that the change in FD region voltage for a given charge amount transferred from the photodiode is reduced, so that the optical sensitivity is lowered. Further, an increase in the threshold voltage of the transfer gate transistor TG results in a decline in the efficiency of charge transfer from the photodiode, which is undesirable.

Hence it is preferable that the second photodiode region PHD2 not be formed, to the extent possible, below the floating diffusion region FD and gate electrode of the transfer gate transistor TG. However, for reasons of device layout or in order to secure an adequate aperture ratio, rather than avoiding formation of the second photodiode region PHD2 below any portion of these regions, it may be sufficient to avoid formation below at least a portion of these regions.

As explained above, since the second photodiode region PHD2 is not formed below the floating diffusion region FD and the electrode of the transfer gate transistor TG, in place of the second P-type well region PW2, a third P-type well region PW3 shallower than the second P-type well region PW2 and with a low impurity concentration is formed; within this well region PW3 the region FD is formed, and the gate electrode TG is formed above the well region PW3.

Figure 18:
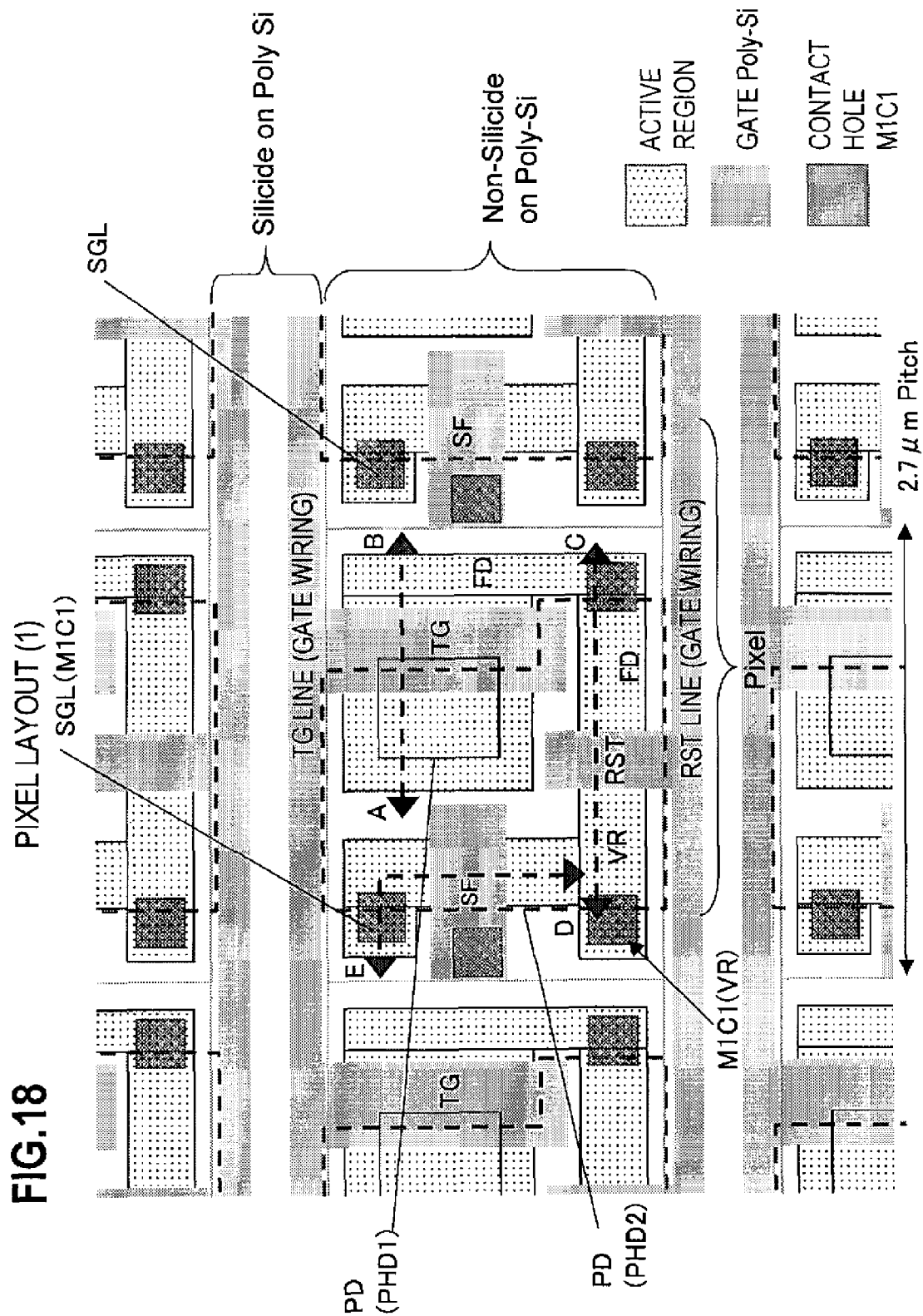
FIG. 18 is a layout diagram of pixels in the first embodiment.

The various regions in the cross-sectional view of FIG. 15 are explained, referring to the layout diagram of FIG. 18. In cross-sectional view A-B, a separation trench STI(2) is formed for a section A, and on the side thereof an N-type first photodiode region PHD1 is formed. At the substrate surface above this first photodiode region PHD1, a high-concentration P-type shield region P+shield is formed to separate the region PHD1 from the insulating film of the substrate surface. And, below the first photodiode region PHD1, an N-type second photodiode region PHD2 is formed. The second photodiode region PHD2 is an inverted L-shape rectangular region, surrounded by a dashed line in FIG. 18. The gate electrode of the transfer gate transistor TG is formed along the cross-section A-B. On the side of this gate electrode is formed an N-type low-concentration drain region NLD; this region NLD serves as the floating diffusion region FD.

Next, in the cross-section C-D, a separation trench STI(2), high-concentration N-type contact region FDN, gate electrode of the reset transistor RST, and high-concentration N-type contact region FDN to which the reset voltage VR is connected, are formed in order. Then, in the cross-section D-E, the gate electrode of the source-follower transistor SF, a high-concentration N-type contact region FDN in contact with the signal line SGL, and a separation trench STI(2), are formed in order.

Then, the second photodiode region PHD2 is embedded extending from below the first photodiode region PHD1 to below the source-follower transistor SF and the reset transistor RST, and is also embedded below a portion of the gate TG of the transfer gate transistor and a portion of the floating diffusion region FD. However, as shown in FIG. 15 and FIG. 18, below the gate electrode of the transfer gate transistor TG, the second region PHD2 is not provided extending beyond the first photodiode region PHD1 toward the floating diffusion region FD, and an effective gate region is secured. Hence to the extent necessary to ensure on/off operation of the transfer gate transistor TG, the second region PHD2 is not formed below the gate electrode. Further, the second photodiode region PHD2 is not provided below a portion of the floating diffusion region FD.

Next, processes to manufacture the image sensor of the first embodiment are explained, referring to the cross-sectional views of FIG. 10 through FIG. 17 and the layout diagrams of FIG. 18 through FIG. 21.

In process (1) of FIG. 10, the element separation structures STI(1) and STI(2) are formed in the peripheral circuit region and pixel region at the surface on the P-type silicon substrate P-Sub. Specifically, in the peripheral circuit portion the silicon substrate is etched to approximately 400 nm, and in the pixel region the silicon substrate is etched to approximately 200 nm; then high-density plasma CVD is used to form a silicon oxide film, chemical or mechanical polishing is performed, and the silicon oxide film is embedded within the etched trenches, to form the element separation structures STI(1) and STI(2). Here, the element separation structures STI(2) are formed in the pixel region so as to be shallower than in the peripheral circuit portion, in order that the second photodiode region PHD2, formed in a later process below the pixel readout transistor, can be made as shallow as possible, in order to improve optical sensitivity.

Next, ion implantation of the first P-type well region in the peripheral circuit portion is performed. First, the deep P-type well region PW-1 is formed by ion implantation with boron B, at energy 300 keV, to concentration 3E13, at tilt angle 0°. The P-type well region PW1 in which the N-channel transistors of the peripheral circuitry are formed must have a high impurity concentration of approximately 3E13 in order to lower the substrate resistivity. Further, the shallow P-type well region PW1-2 is formed in the peripheral circuit portion by ion implantation of born B, at energy 30 keV, to a concentration of approximately 5E12, at a tilt angle of 7°. This ion implantation is performed in order to control the peripheral circuit N-channel transistor threshold voltage Vt.

On the other hand, in order to form a peripheral circuit N-channel well region (not shown), ion implantation of phosphorus P is performed, at energy 600 keV to concentration 3E13 at a tilt angle of 0°, and ion implantation of arsenic As is performed, at energy 160 keV to concentration 2E13 to 3E13 at a tilt angle of 7°.

In process (2) in FIG. 11, the second P-type well region PW2 is formed in the pixel portion. This second P-type well region PW2 is formed by ion implantation of boron B, at energy 80 keV, to a concentration of approximately 3E13 at a tilt angle of 7°. And in the pixel portion, ion implantation of the second P-type well region PW2 is not performed below the gate electrode of the transfer gate transistor TG or the floating diffusion region FD. Further, the ion implantation is performed at a lower energy than the implantation of the first P-type well region PW1-1 in the peripheral circuit portion, to form the second P-type well region PW2 at a shallower depth than the first P-type well region. By this means, the second photodiode region PHD2 which is formed later can be formed at a shallower depth.

Further, ion implantation of this second P-type well region PW2 also serves to control the readout transistor threshold voltage Vt within the pixel.

The third P-type well region PW3 specifically for the photodiode PD, transfer gate transistor TG, and floating diffusion region ED in the pixel is then formed by ion implantation of boron B, at energy 30 keV to concentration 2E12, at a tilt angle of 7°. The third P-type well region PW3 is formed by implanting boron B to a concentration ½ or less than N-channel transistor threshold control concentration in the peripheral circuit in the previously formed first well region PW1, to further lower the threshold voltage Vt of the transfer gate transistor TG. By lowering the threshold voltage Vt of the transfer gate transistor TG, the efficiency of charge transfer from the photodiode PD to the floating diffusion region FD can be improved. At the same time, by raising the concentration of the third P-type well region PW3 above the substrate concentration, the potential is raised for electrons in the channel portion of the transfer gate transistor TG, and the saturation charge amount of the photodiode PD is increased. Also, the impurity concentration in the third P-type well region PW3 is made lower than in the second P-type well region PW2, and by this means the threshold voltage of the transfer gate transistor is controlled to be low.

Figure 12:
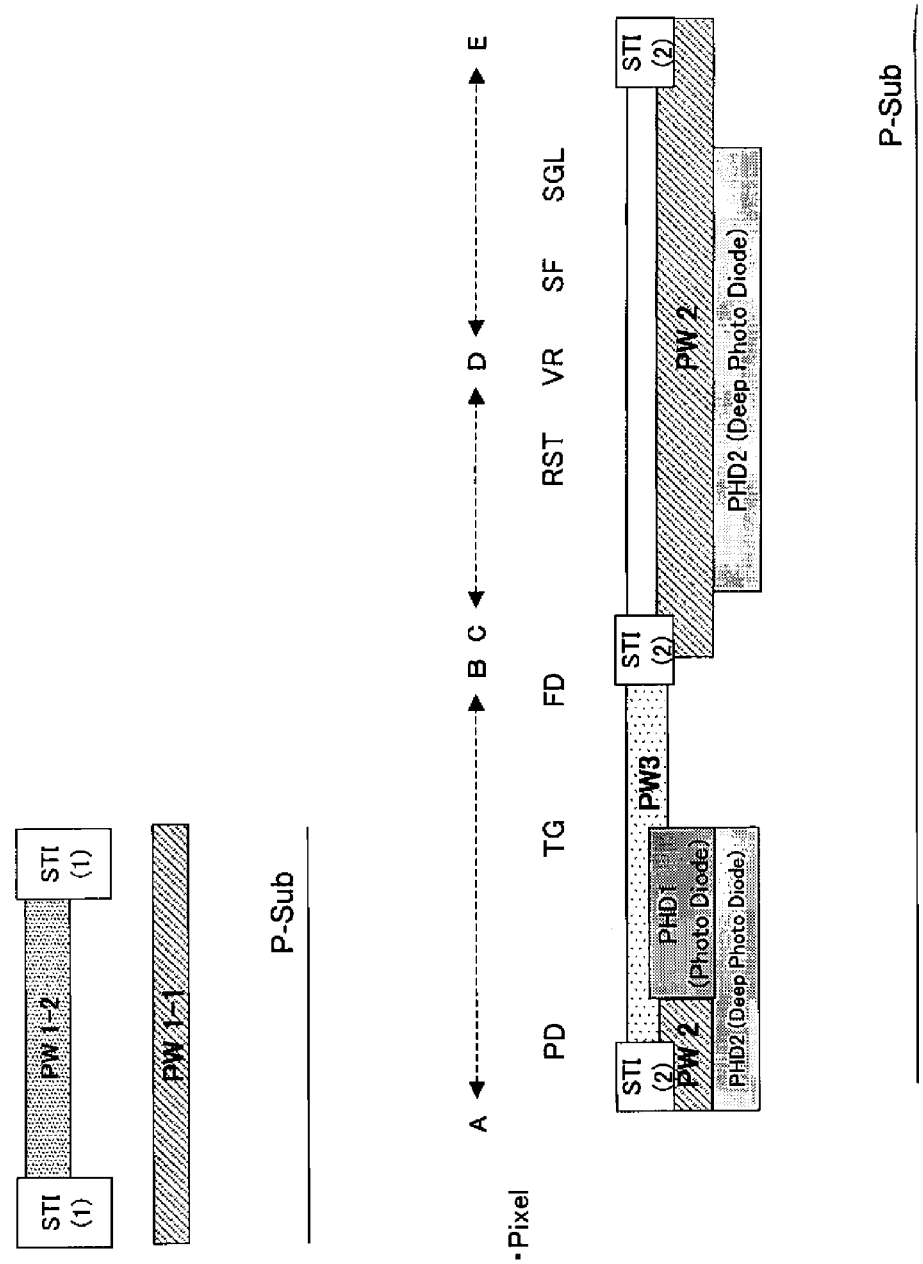
FIG. 12 is a cross-sectional view showing a manufacturing process in the first embodiment.

In process (3) in FIG. 12, ion implantation is performed to form the first photodiode region PHD1 in the pixel region. This ion implantation comprises ion implantation of phosphorus P at energy 207 keV, to a concentration of 1E12 to 2E12 at a tilt angle of 7°, and ion implantation of phosphorus P at energy 135 keV to a concentration of 1E12 to 2E12 at a tilt angle of 7°. By means of this ion implantation, the previously formed third P-type well region PW3 is cancelled, and a first N-type diffusion region PHD1 is formed in a shallow region comprised by the photodiode PD.

Next, a resist mask having an aperture portion overlapping the first photodiode region PHD1 and extending to below the separation structure STI(2) surrounding to the region PHD1, is used to perform ion implantation of phosphorus P at energy 325 keV to a concentration of 1E12 to 5E12 at a tilt angle of 7°, to form the second N-type diffusion region PHD2 (deep photo Diode). This serves as the second photodiode region PHD2. This ion-implanted region is as indicated by the dashed line PD (PHD2) in the layout diagram of FIG. 20. In the pixel region, the separation structures STI(2) are formed to be shallow, and the second P-type well region PW2 is also formed to be shallow, so that the depth of the second photodiode region PHD2 can be made comparatively shallow.

In process (4) of FIG. 13, a gate oxide film GOX is formed to a thickness of approximately 8 nm on the substrate surface by thermal oxidation at approximately 800° C., and on this a polysilicon film GPOLY is grown by CVD a thickness of approximately 180 nm. Then, phosphorus P is ion-implanted into the polysilicon film of the N-channel transistor portion of the peripheral circuitry and the pixel polysilicon film, at energy 20 keV to a concentration of 4E15, at a tilt angle of 7°, followed by annealing for approximately 60 minutes at 800° C. to perform N-type doping of the polysilicon film. The polysilicon film GPOLY is then patterned to form the gate electrodes. Thereafter, in the N-channel transistor portion of peripheral circuit and in the pixel, the gate electrodes are used as a mask to perform ion implantation of phosphorus P at an energy of 20 keV to a concentration of 4E13, at a tilt angle of 0° (LDD: Light Doped Drain implantation), to form the source-drain regions NLD.

Next, boron B is ion-implanted into the substrate surface, in which the first photodiode region PHD1 is formed in the pixel, at an energy of 10 keV to a concentration of approximately 1E13, at a tilt angle of 7°, to form a shield diffusion layer P+shield; this serves as the structure burying the N-type diffusion layer PHD1 of the photodiode PD. That is, the first photodiode region PHD1 is formed separated from the oxide film at the substrate surface, and so the dark current due to leak currents resulting from the oxide film can be suppressed.

As a result of the above configuration, the depth at which the light-receiving region of the photodiode is formed is as follows. In the first photodiode region PHD1, the diffusion layer PHD1 is formed up to the shallow region close to the substrate surface, so that the depletion layer of the photodiode extends from a depth of approximately 0.1 μm on the shallow side to deep in the substrate. On the other hand, in the second photodiode region PHD2, the second P-type well region PW2 has a depth of approximately 0.3 μm, and so the depletion layer of the second photodiode region PHD2 extends from a depth of approximately 0.4 μm on the shallow side to deep into the substrate, extending to approximately 1.0 μm on the deep side. That is, the first photodiode region PHD1 extends from 0.1 to 0.4 μm, and the second photodiode region PHD2 extends from 0.4 to 1.0 μm.

Hence as a rough calculation from the optical transmittance curve in silicon of FIG. 2, the ratio of the optical sensitivity (per unit area) of the first photodiode region PHD1 to the optical sensitivity (per unit area) of the second photodiode region PHD2 alone is approximately 65% for red, approximately 58% for green, and approximately 36% for blue. On the other hand, assuming a deep first P-type well region PW1 is formed in the pixel region in place of the shallow second P-type well region PW2, and a second photodiode region PHD2 is similarly formed therebelow, the second photodiode region PHD2 is at a depth of approximately 1.0 to 1.4 μm. In this case, the optical sensitivity (per unit area) of the second photodiode region PHD2, compared with the case of the above shallow PHD2, is 55% for red, 48% for green, and 14% for blue. That is, it can be seen that the optical sensitivity is greatly improved by embedding the second photodiode region PHD2 below a shallow second P-type well region PW2, as in this embodiment.

Figure 14:
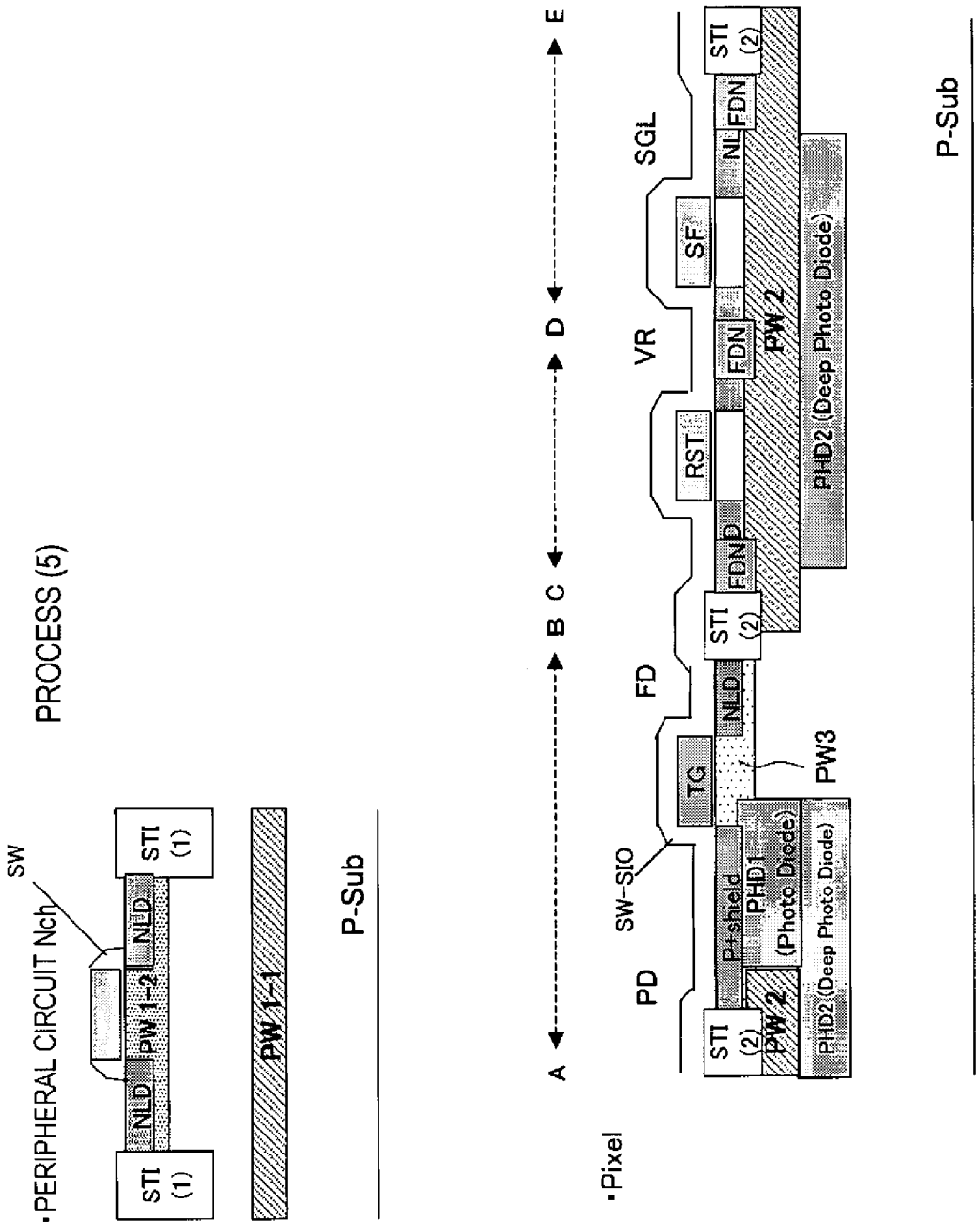
FIG. 14 is a cross-sectional view showing a manufacturing process in the first embodiment.

In process (5) in FIG. 14, N-type ion implantation of phosphorus P, at an energy of 15 keV to a concentration of approximately 2E15, is performed to form a high-concentration contact region FDN for contact formation in the source-drain region of the reset transistor RST and source-drain region of the source-follower transistor SF in the pixel.

Next, a side wall SW is formed at the gate electrodes in the peripheral circuit portion. To this end, a 100 nm silicon oxide film is formed by thermal oxidation, resist is formed covering the transistors, photodiode PHD and floating diffusion region FD in the pixel, and this is used as a mask to perform full-surface etching of the silicon oxide film. As a result, a side wall is formed at the peripheral circuit portion, and gate electrode of gate line to the transfer gate transistor of the pixel region, and of the gate line to the reset transistor. Also, a silicon oxide film SW-SIO for the side wall is left in the pixel.

In process (6) in FIG. 15, ion implantation of phosphorus P is performed at an energy of 13 keV, to a concentration of 2E15 at a tilt angle of 7°, to form a high-concentration source-drain region NSD in the N-channel transistor region of the peripheral circuitry. Then, after treating the silicon substrate surface with hydrofluoric acid HF, a cobalt Co film is formed by sputtering, and rapid thermal annealing at approximately 520° C. is performed to form cobalt silicide CoSi on the gate electrodes and silicon surface of the source-drain region NSD. Unreacted cobalt film on the silicon oxide film is removed, and rapid thermal annealing is again performed at approximately 840° C.

In process (7) in FIG. 16, an insulating film is formed, and contact holes are formed. First, a silicon oxide film P-SIO is formed to approximately 20 nm by plasma CVD, and a silicon nitride film P-SIN is formed to approximately 70 nm by plasma CVD. On this two-layer insulating film is formed a silicon oxide film HDP-SIO, to a thickness of approximately 1000 nm by HDP-CVD (High-Density Plasma CVD), and the surface is then flattened by CMP polishing. Then, contact holes M1C1 are formed in the region FDN in which implantation for contact was performed in the pixel. Also, a contact hole to the P-type well region PW2 in the pixel, and a contact hole M1C2 in the peripheral circuitry, are formed. At the same time, a contact hole M1C2 to the P-type well region PW1 is also formed. The contact holes M1C2 are contact holes to a region in which cobalt silicide CoSi was previously formed; the silicide acts as an etching stopper, and so a different process from that used for the contact holes M1C1 is employed.

Figure 17:
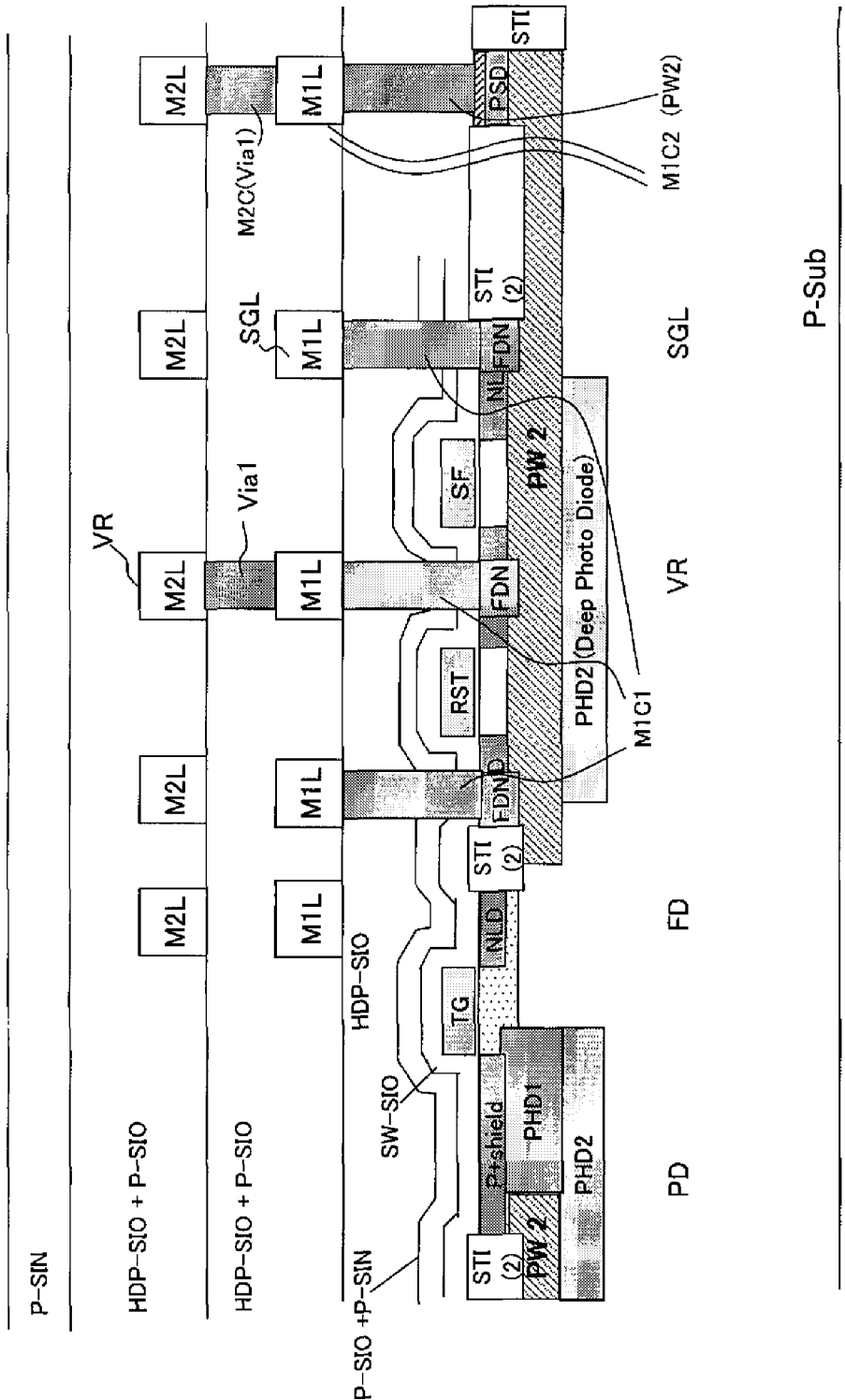
FIG. 17 is a cross-sectional view showing a manufacturing process in the first embodiment.

In process (8) of FIG. 17, after opening the contacts, sputtering of titanium Ti (to approximately 30 nm) and of titanium nitride TiN (to approximately 50 nm) is performed, and a tungsten W film is deposited by CVD (to approximately 300 nm) to bury the contact holes; the Ti/TiN/W three-layer film on the surface is then removed by CMP polishing, to form tungsten plugs in the contact holes. Then, first metal wiring MIL is formed by a process of sputter film deposition of Ti (approximately 30 nm)/TiN(approximately 50 nm)/Al(approximately 400 nm)/Ti(approximately 5 nm)/TiN(approximately 50 nm) and photoetching.

Through deposition of an HDP plasma oxide film HDP-SIO (approximately 750 nm) and a plasma oxide film P-SIO (approximately 1100 nm) and CMP polishing, a flattened interlayer insulating film is formed on the first metal wiring M1L. Vias Via1 are formed in this interlayer insulating film, and by means of a process similar to the above-described process of contact W plug formation and first metal wiring formation, W plugs are formed in the vias Via1 and second metal wiring M2L is formed.

Figure 21:
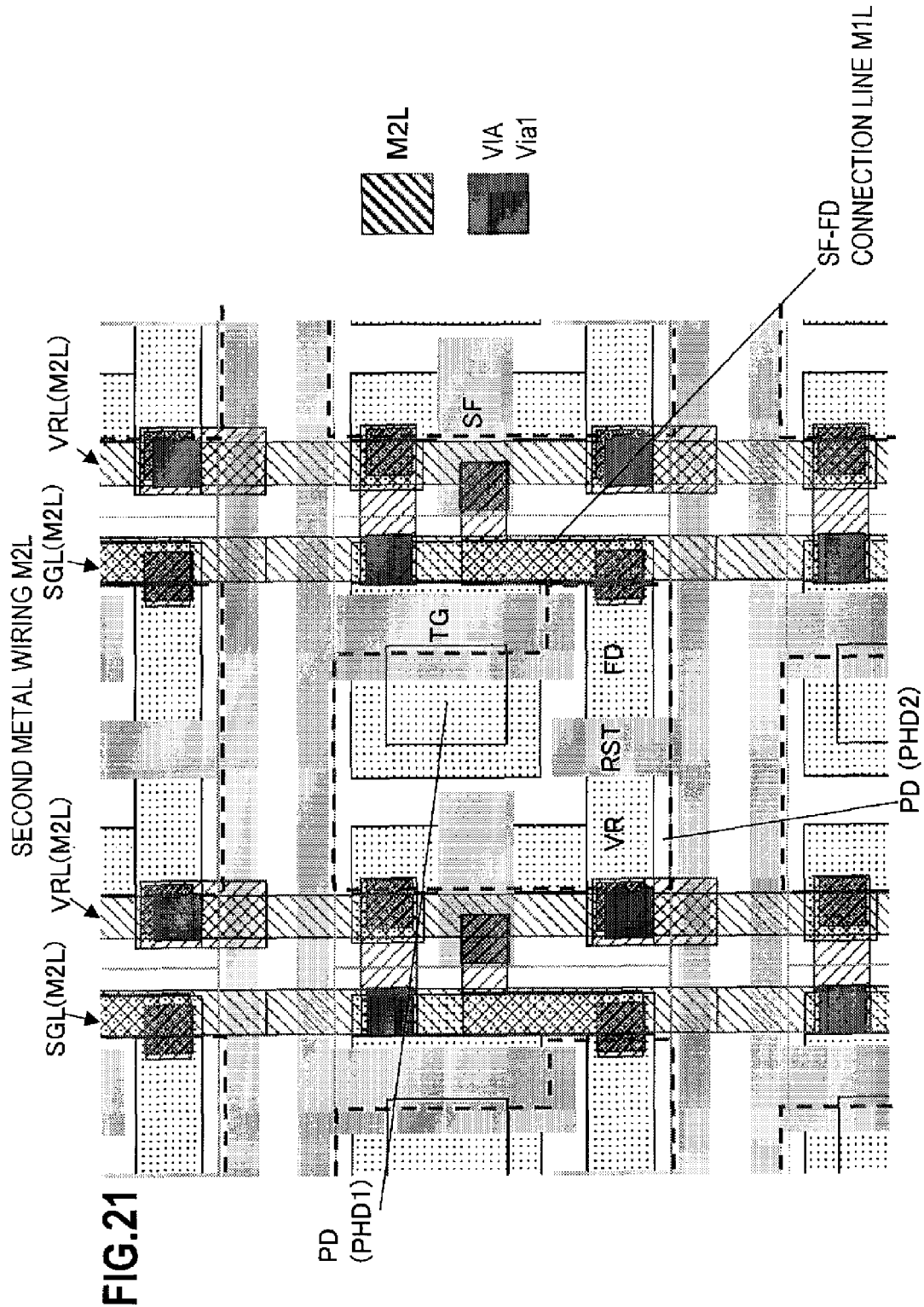
FIG. 21 is a layout diagram of pixels in the first embodiment.

The vias Via1 and second metal wiring M2L are formed only in the peripheral circuit portion; in the pixel, only up to the first metal wiring M1L is formed, and second metal wiring is not formed. By this means, blocking of light incident on the pixel is suppressed. In the cross-sectional view of FIG. 17, second metal wiring M2L is formed for the reset voltage wiring VR; but as shown in FIG. 21, this second metal wiring M2L is positioned outside the second photodiode region PHD2 in the pixel, and so does not block incident light. Finally, by means of a process similar to that of flattening the first metal wiring, a flattened insulating film HDP-SIO/P-SIO is formed on the second metal wiring, and a cover film, comprising a silicon nitride film P-SIN, is deposited by plasma CVD.

The layout diagram of FIG. 18 shows a state in which the contact holes M1C1 of FIG. 16 are formed. In one pixel, the N-type second photodiode region PHD2 is buried so as to overlap with most of the pixel region. However, the second photodiode region PHD2 is not formed under a portion of the floating diffusion region FD and under most of the gate electrode of the transfer gate transistor TG. The reason for this was explained above; by this means, the junction capacitance of the floating diffusion region ED can be kept low, and the threshold voltage of the transfer gate transistor TG can be kept low. Also, in FIG. 18, gate wiring (TG line in the figure) extending horizontally to the transfer gate transistor TG, and gate wiring (RST line in the figure) extending to the reset transistor RST, are formed using cobalt silicide on the surface, with low resistance. On the other hand, cobalt silicide is not formed on the gate electrodes of the transistors TG, RST, SF within the pixel. The reason for this is to eliminate the light-blocking effect of cobalt silicide within the pixel, so that incident light is not prevented from reaching the second photodiode region PHD2.

Figure 19:
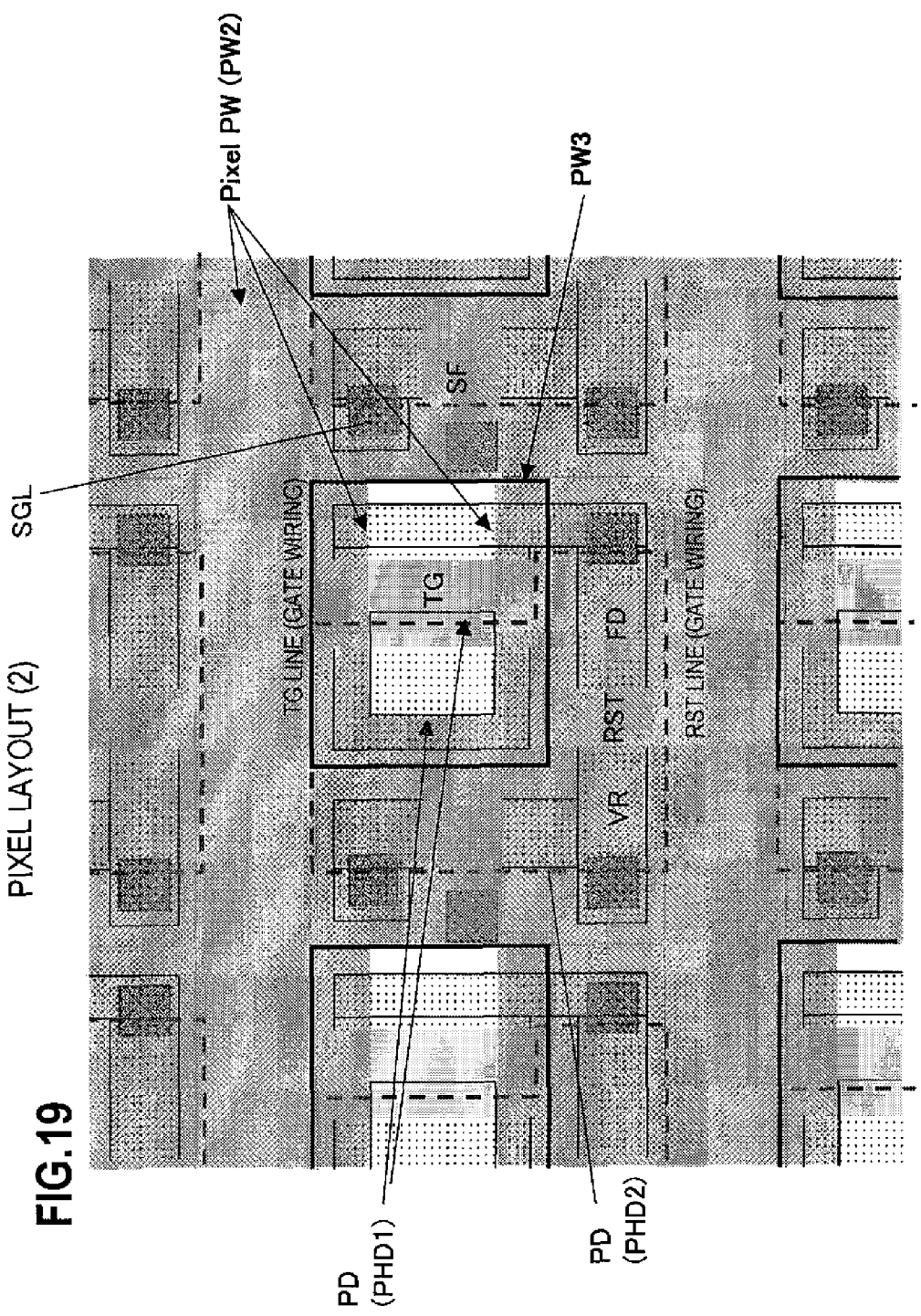
FIG. 19 is a layout diagram of pixels in the first embodiment.

In the layout diagram of FIG. 19, the relation between the second P-type well region PW2 in the pixel region and the mask forming the third P-type well region PW3 is shown. The mask for the third P-type well region PW3 is indicated by a boldface rectangle (with ion implantation within the boldface rectangle); the mask for the second P-type well region PW2 is indicated by a gray color (with ion implantation within the gray area). As a result, the second P-type well region PW2 is not formed at the gate electrode of the transfer gate transistor TG and on either side thereof, and consequently only a shallower low-concentration third P-type well region PW3 is formed thereof. In particular, the second photodiode region PHD2 is not formed below the gate electrode of the transfer gate transistor TG and below the floating diffusion region FD, and in this region the shallow low-concentration third P-type well region PW3 is formed. By this means, the threshold voltage of the transfer gate transistor TG can be made low, and the junction capacitance of the floating diffusion region FD is reduced.

Figure 20:
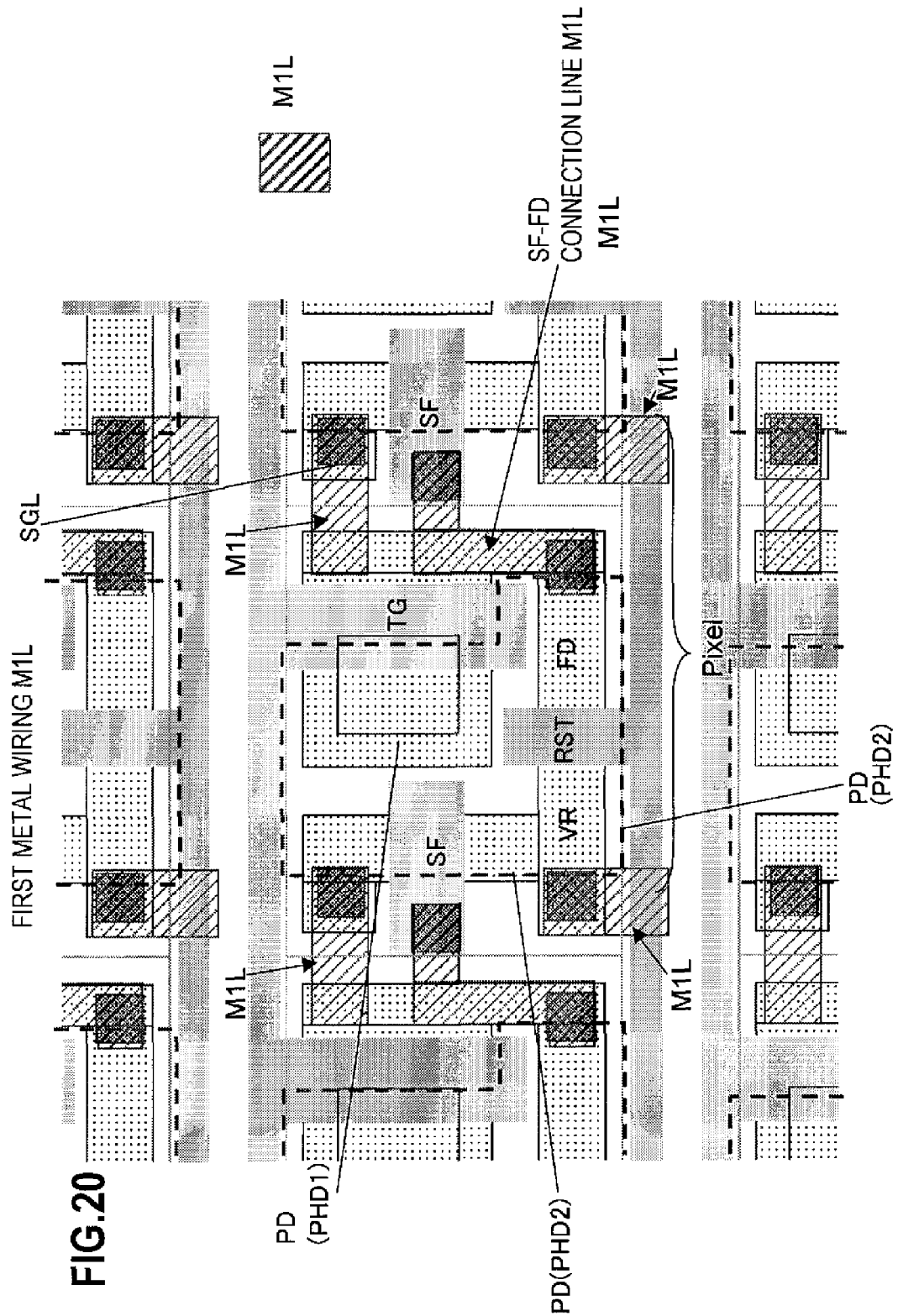
FIG. 20 is a layout diagram of pixels in the first embodiment.

The layout diagram of FIG. 20 shows a state in which the first metal wiring M1L of FIG. 17 is formed. The first metal wiring M1L is formed connected to contact vias. In particular, the contact via of the floating diffusion region FD and the contact via on the gate electrode of the source-follower transistor SF are connected by the first metal wiring M1L (SF-FD in the figure). And, the first metal wiring M1L is formed outside the first and second photodiode regions PHD1 and PHD2 so as not to overlap with those regions, and so as not to block incident light.

The layout diagram of FIG. 21 shows a state in which the second metal wiring M2L of FIG. 17 is formed. The second metal wiring M2L, which connects the via Via1 formed in the interlayer insulating film, is formed so as to extend in the vertical direction, and a signal line SGL and reset voltage line VRL are formed. This second metal wiring M2L is also formed outside the first and second photodiode regions PHD1 and PHD2 so as not to overlap with those regions, and so as not to block incident light.

As is clear from the above layout diagrams, the shallow first photodiode region PHD1 is formed in a small region within the pixel, and the deep second photodiode region PHD2 is formed in a comparatively broad region in the pixel. Incident light undergoes photoelectric conversion in both photodiode regions PHD1 and PHD2. In this embodiment, the area occupancies of the two photodiode regions PHD1 and PHD2 in the pixel are approximately 4% and 34% respectively. By providing both regions, the effective aperture ratio, even when taking into consideration the attenuation of light reaching the deep region of the second region PHD2, is approximately 26% for red, approximately 24% for green, and approximately 16% for blue, representing great improvements compared with the case of the first region PHD1 alone (4%). Moreover, by forming the second P-type well region PW2 to be shallow and forming the second region PHD2 to be shallow, the effective aperture ratio is further raised.

Second Embodiment

The second embodiment is an example of application to a three-transistor type APS. FIG. 22 through FIG. 25 are cross-sectional views showing processes, and FIG. 26 through FIG. 30 are pixel layout diagrams. The cross-sectional views of FIG. 22 through FIG. 25 show cross-sections along the cross-sections A-B and C-D-E in the layout diagram of FIG. 26.

The three-transistor type APS pixel circuit diagram is as shown in FIG. 8; in addition to a photodiode PD, a reset transistor RST, selector transistor SLCT, and source-follower transistor SF are provided. That is, the cathode terminal of the photodiode PD also serves as the floating diffusion region FD, and there is no transfer gate transistor TG.

Figure 22:
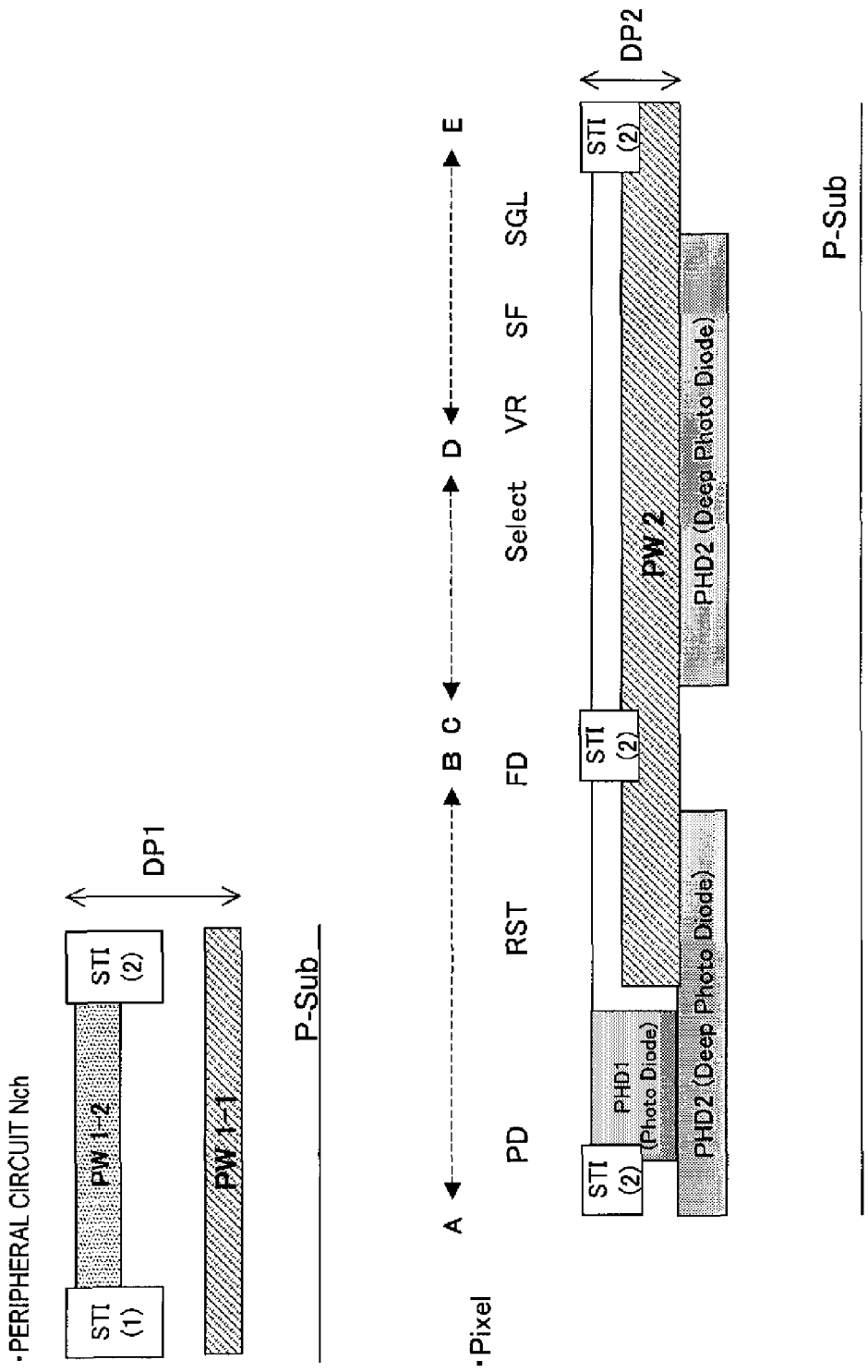
FIG. 22 is a cross-sectional view showing a manufacturing process in a second embodiment.

As shown in FIG. 22, in the second embodiment as well, the depth DP2 of the second P-type well region in the pixel region is shallower than the depth DP1 of the first P-type well region in the peripheral circuit region, and the second photodiode region PHD2 is buried below this shallow second P-type well region PW2. Also, the first photodiode region PHD1 also serves as the source region of the reset transistor RST, without being separated from the substrate surface. In the three-transistor type APS, a transfer gate transistor is not provided, and an independent floating diffusion region FD is not formed. Hence in this embodiment, there is no stipulation that the second photodiode region PHD2 not be formed below these elements.

The process of FIG. 22 corresponds to FIG. 12 in the first embodiment. That is, the same processes as in FIG. 10 and FIG. 11 of the first embodiment are used in formation of the separation structures STI, ion implantation of the first P-type well region PW1 of the peripheral circuitry, and ion implantation of the second well region PW2 in the pixel region, but because in the three-transistor structure there is no transfer gate transistor TG, ion implantation of a third P-type well region is not performed. And, in the pixel region, ion implantation is performed to form the second P-type well region PW2 avoiding only the first photodiode region PHD1, for making the well region for the reset transistor RST, selector transistor SLCT, and source-follower transistor SF.

Next, ion implantation of the first photodiode region PHD1 is performed. In this ion implantation, phosphorus P is implanted at (1) 200 keV, to approximately 1E13, at 7°; (2) 100 keV, to approximately 1E13, at 7°; and (3) 50 keV, to approximately 1E13, at 70. Ion implantation of this first region PHD1 may be combined with ion implantation of N-type well region for P-channel transistor in the peripheral circuit.

Next, by ion implantation of phosphorus P at energy 325 keV to a concentration of 1E12 to 5E12, at a tilt angle of approximately 7°, in a region overlapping the first photodiode region PHD1 and extending to below the separation structure STI(2) surrounding this region PHD1, and to below the readout transistor, the second photodiode region PHD2 is formed. This second region PHD2, as shown in the layout diagram of FIG. 28, extends below the first photodiode region PHD1, the reset transistor RST, the selector transistor SLCT, and the source-follower transistor SF, and is formed over substantially the entire area outside the region in which metal wiring, described below, is formed.

The second photodiode region PHD2 has a low ion implantation concentration of approximately 1E12, and it is desirable that the second photodiode region PHD2 has a structure which is completely depleted. That is, through complete depletion of the second photodiode region PHD2, the junction capacitance at this region PHD2 can be made zero. However, even when completely depleted, the region PHD2 has lower potential for electrons than the surrounding P-type region, and captured electrons arising from photoelectric conversion in the region PHD2 can be reliably transferred to the first photodiode region PHD1. In this embodiment, the anode of the photodiode PD also serves as the floating diffusion region FD, and so by reducing the junction capacitance at this anode to the extent possible, the change in voltage for a given amount of captured charge (electrons) can be made large, and a high charge-voltage conversion efficiency can be realized.

Figure 23:
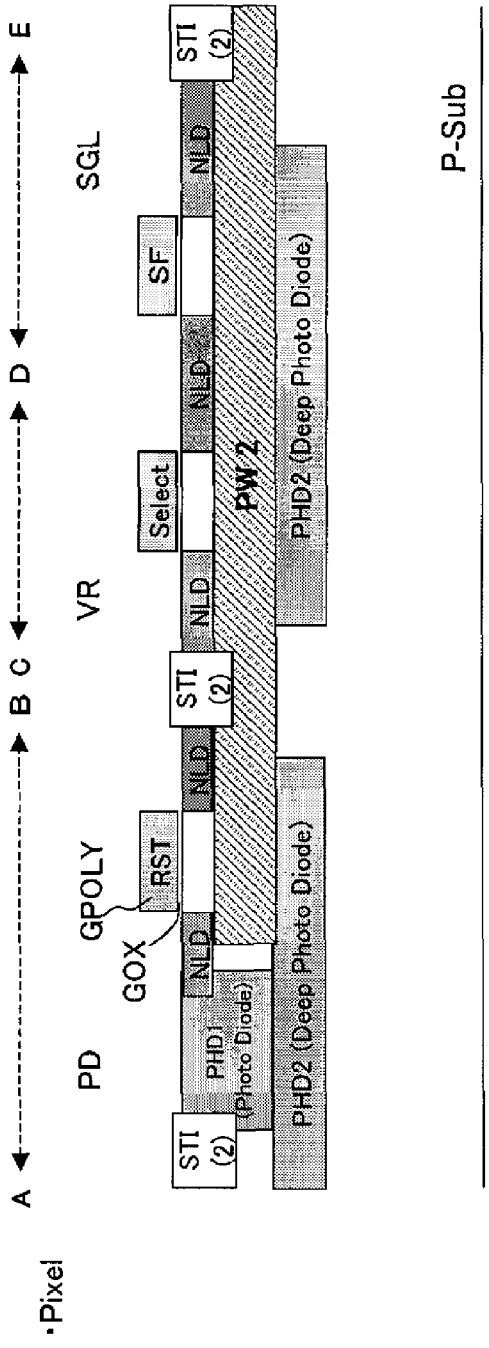
FIG. 23 is a cross-sectional view showing a manufacturing process in the second embodiment.

In the process in FIG. 23, similarly to the first embodiment, the gate oxide film GOX and gate electrode GPOLY are formed. The depth of the light-receiving region of the photodiode is as follows. First, the first region PHD1 is not depleted from the substrate surface to the depth of the connection with the second region PHD2, and so contributes little to photoelectric conversion. On the other hand, in the second region PHD2, the second P-type well region PW2 has a depth of approximately 0.3 µm, and so the depleted layer of the second region PHD2 which is a light-receiving region extends from a depth of approximately 0.4 µm on the shallow side to approximately 1.5 µm on the deep side of the substrate.

In the process of FIG. 24, the same process as in FIG. 14 is used to form the low-concentration source-drain region NLD, contact high-concentration region PDN, and side wall oxide films SW and SW-SIO.

Figure 25:
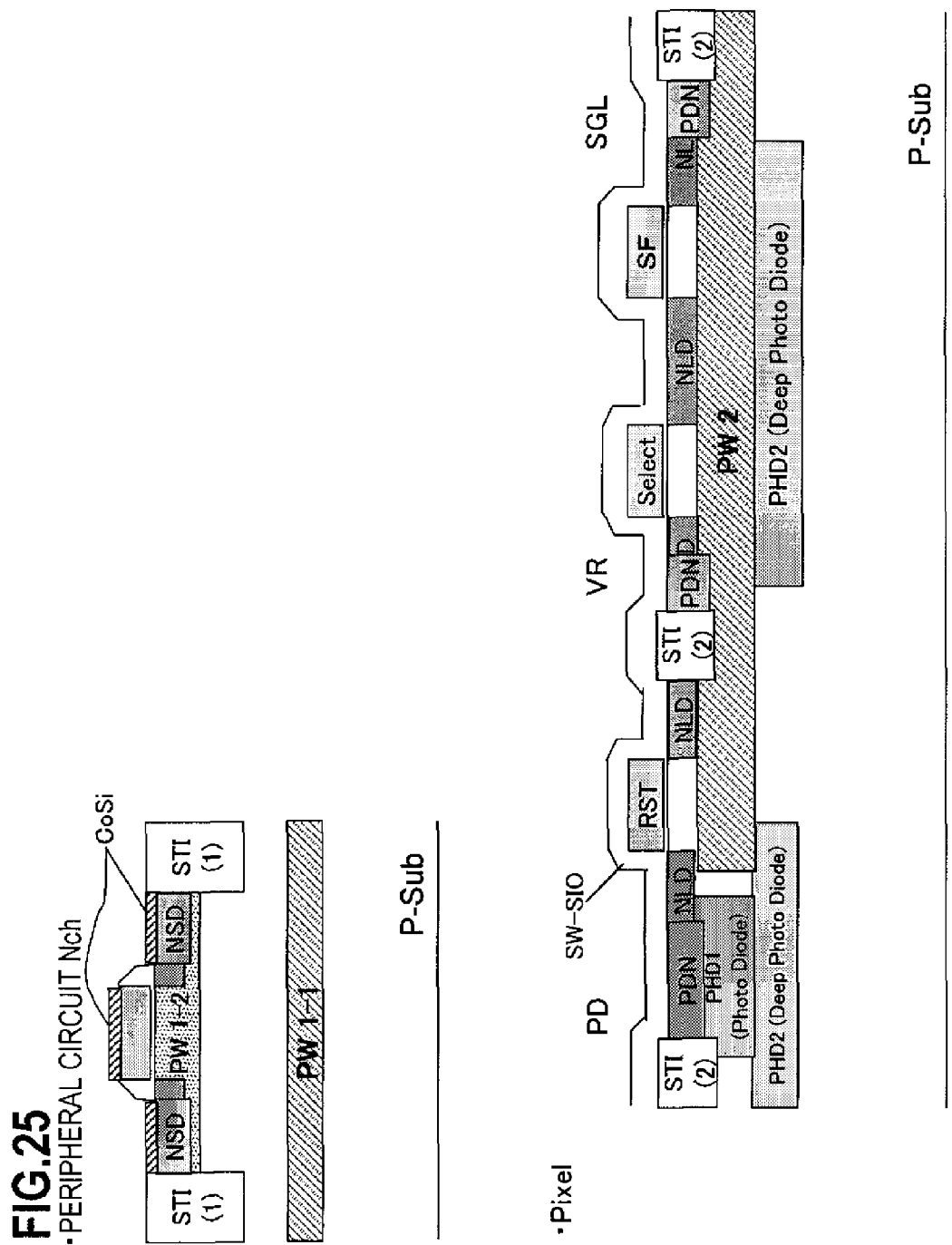
FIG. 25 is a cross-sectional view showing a manufacturing process in the second embodiment.

In the process of FIG. 25, the same process as in FIG. 15 is used to form N-type and P-type high-concentration source-drain regions NSD and PSD and a cobalt silicide film CoSi. However, in the figure, the P-type region PSD is not shown.

Figure 26:
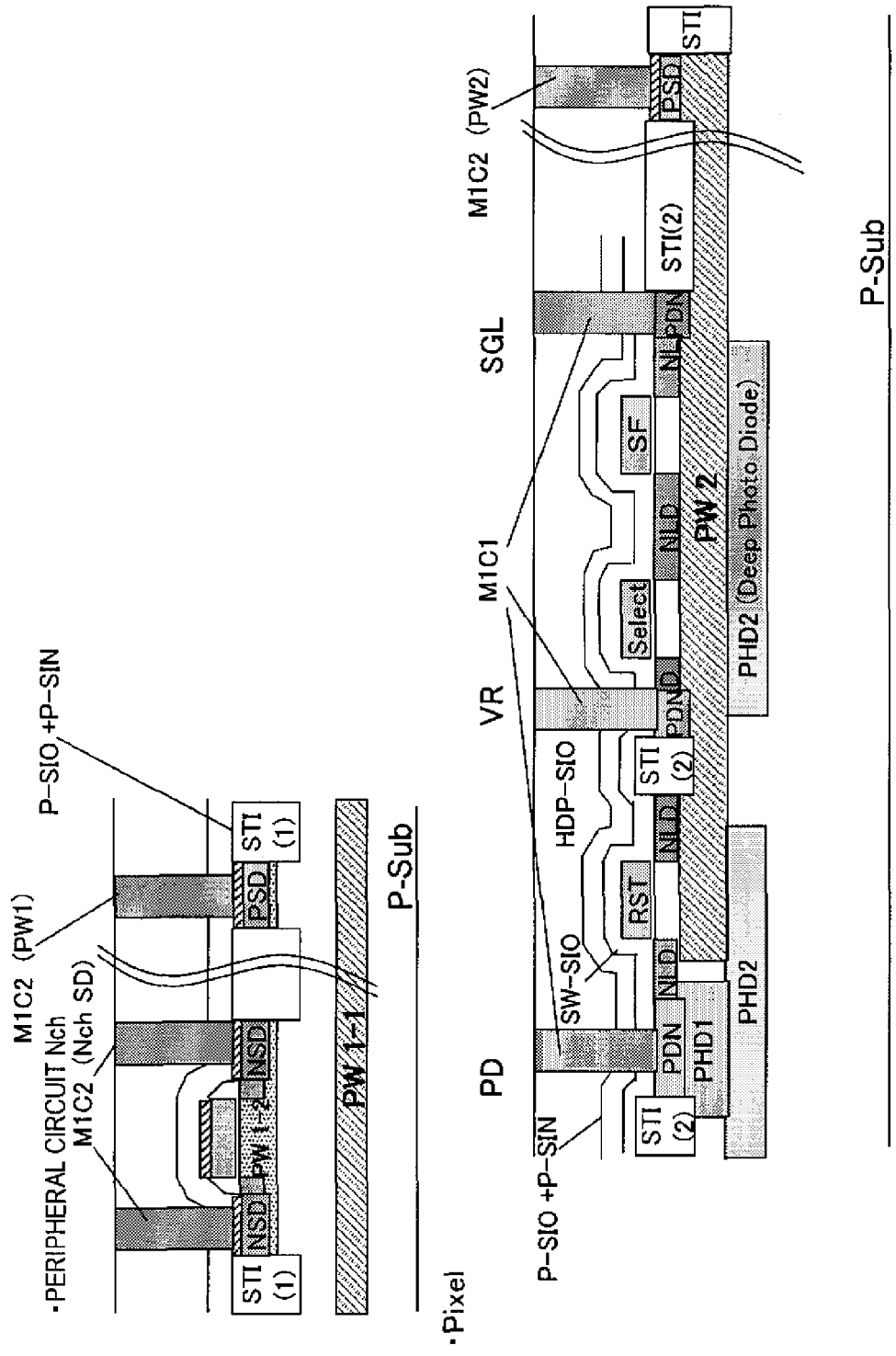
FIG. 26 is a cross-sectional view showing a manufacturing process in the second embodiment.

In the process of FIG. 26, the same process as in FIG. 16 is used to form an insulating film and contact holes M1C1 and M1C2. In this case, contact holes M1C1 are formed in the region PDN in which ion implantation was performed to form a contact in the pixel. On the other hand, contact holes M1C2 other than these contact holes M1C1 are also formed. In FIG. 26, a contact hole M1C2 to the P-type well region PW1 in the peripheral circuitry, and a contact hole M1C2 to the second P-type well region PW2 in the pixel, are shown. The two types of contact hole M1C1, M1C2 are formed separately in order to use different processes in areas where the cobalt silicide layer can be utilized as an etching stopper and in other areas.

Figure 27:
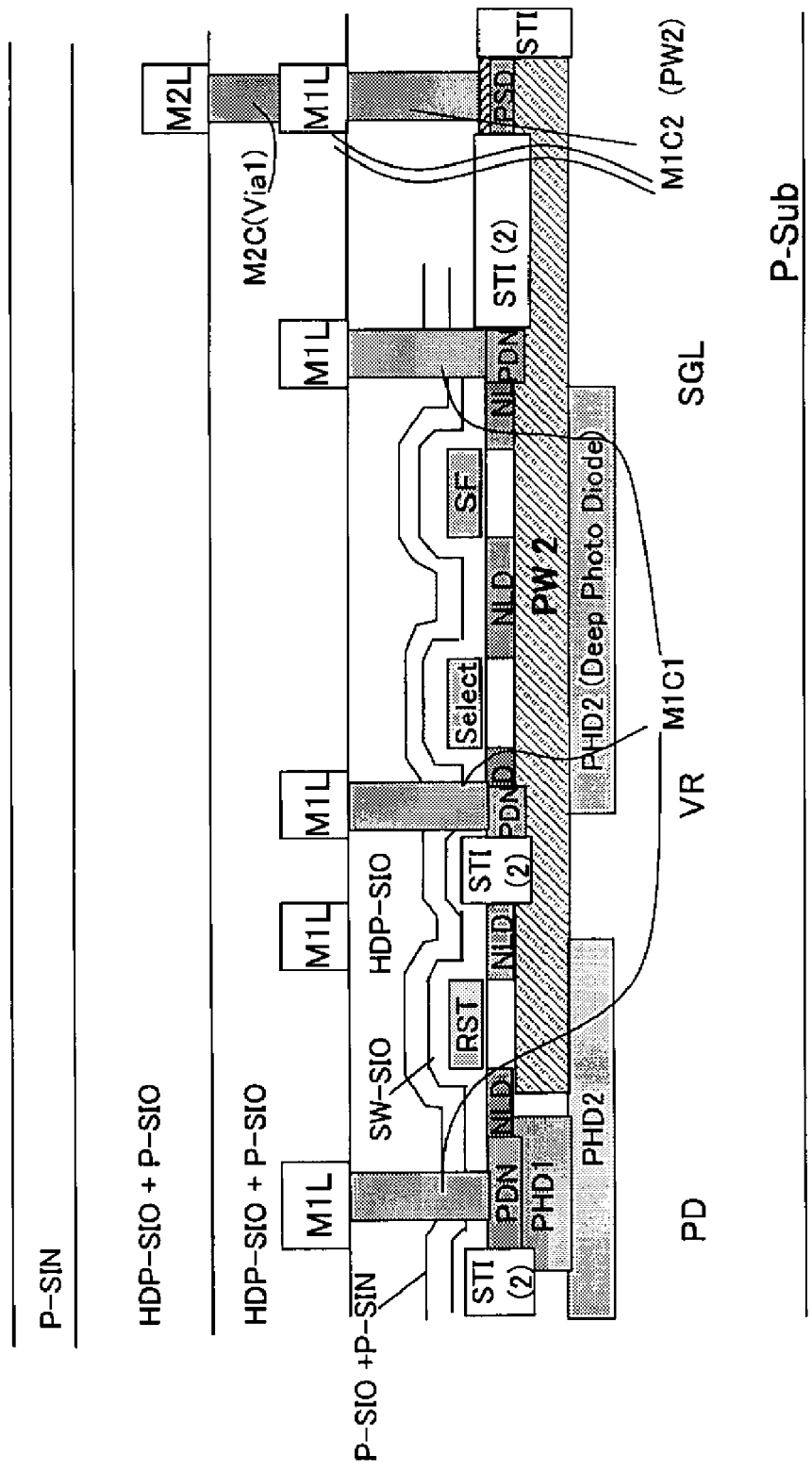
FIG. 27 is a cross-sectional view showing a manufacturing process in the second embodiment.

In the process of FIG. 27, the same process as in FIG. 17 is used to form the contact vias M1C1, first metal wiring M1L, interlayer insulating films HDP-SIO and P-SIO, via Via1, and second metal wiring M2L. Here, it is desirable that the first metal wiring M1L not be formed above the second photodiode region PHD2 insofar as possible, in order to prevent lowering of the aperture ratio. However, the wiring may be formed in the minimum number of places required and in the smallest possible area.

Figure 28:
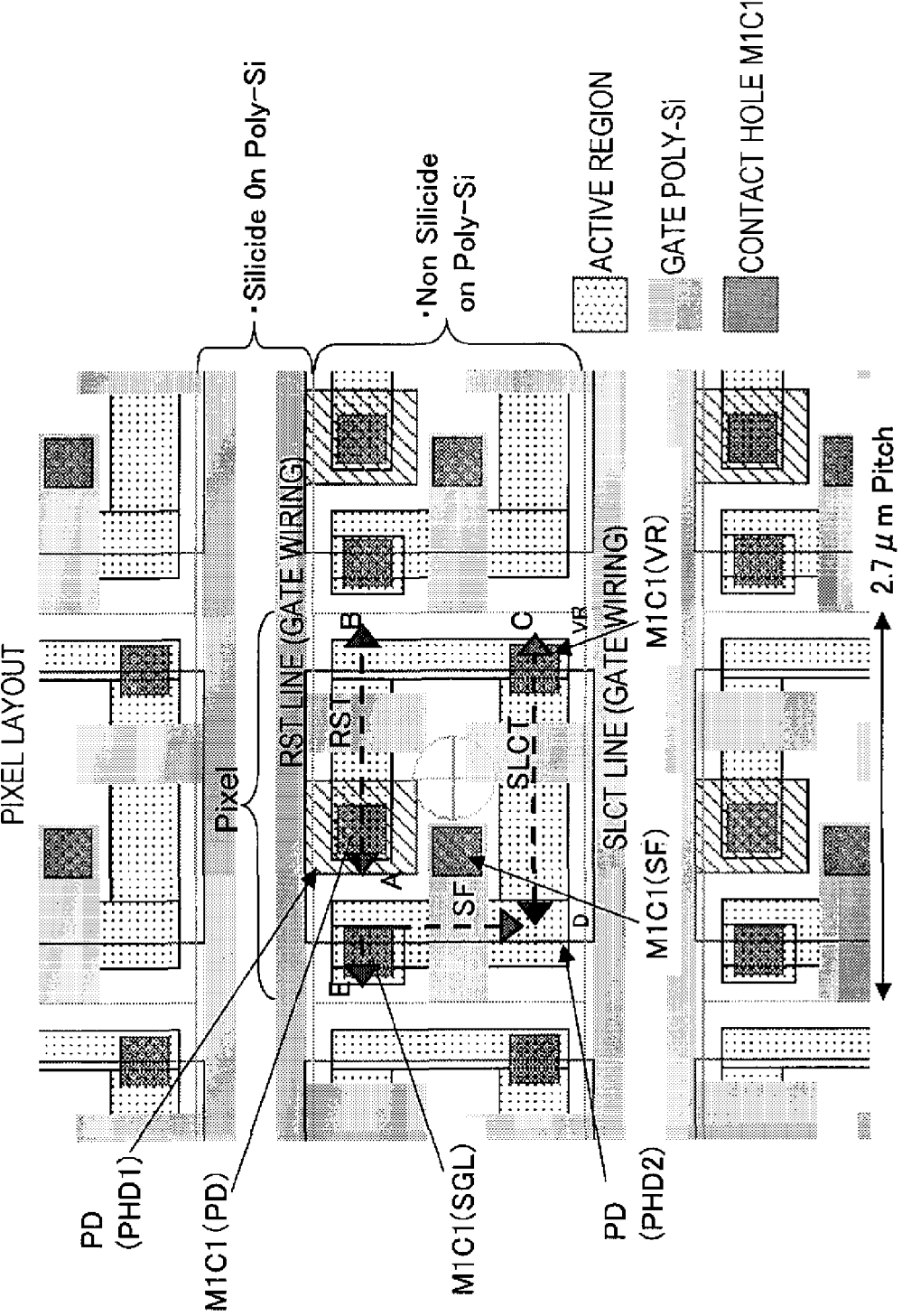
FIG. 28 is a layout diagram of pixels in the second embodiment.

As shown in the layout diagram of FIG. 28, silicide film is not formed on polysilicon gate electrodes in the pixel, in order that incident light can be incident on the photodiode regions PHD1 and PHD2. And, silicide film is formed on the gate electrode line of the reset transistor RST and gate electrode line of the selector transistor SLCT extending horizontally, to lower the resistance.

Figure 29:
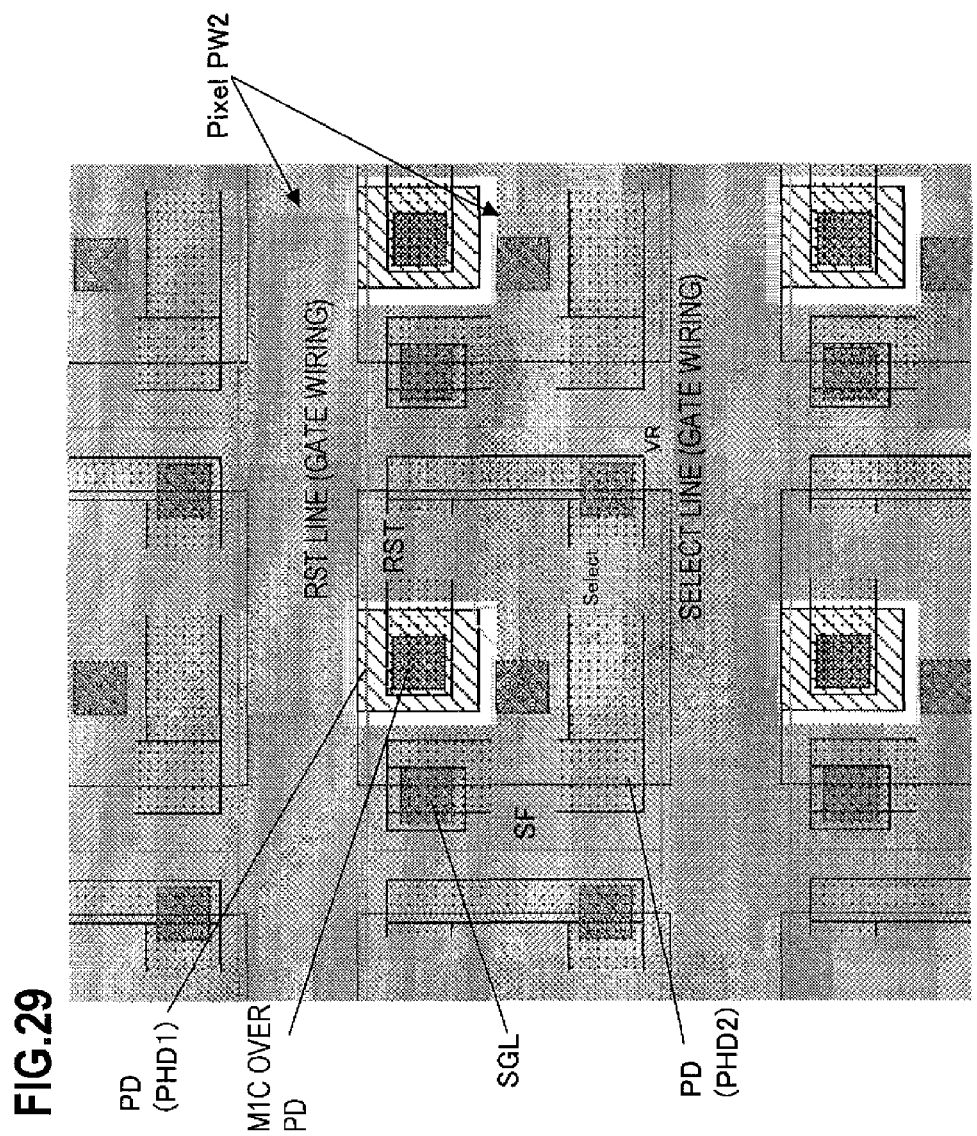
FIG. 29 is a layout diagram of pixels in the second embodiment.

In the layout diagram of FIG. 29, the mask pattern of the second P-type well region PW2 is shown in gray. The second P-type well region PW2 is formed in the gray portion, and is not formed in the portion of the first photodiode region PHD1.

Figure 30:
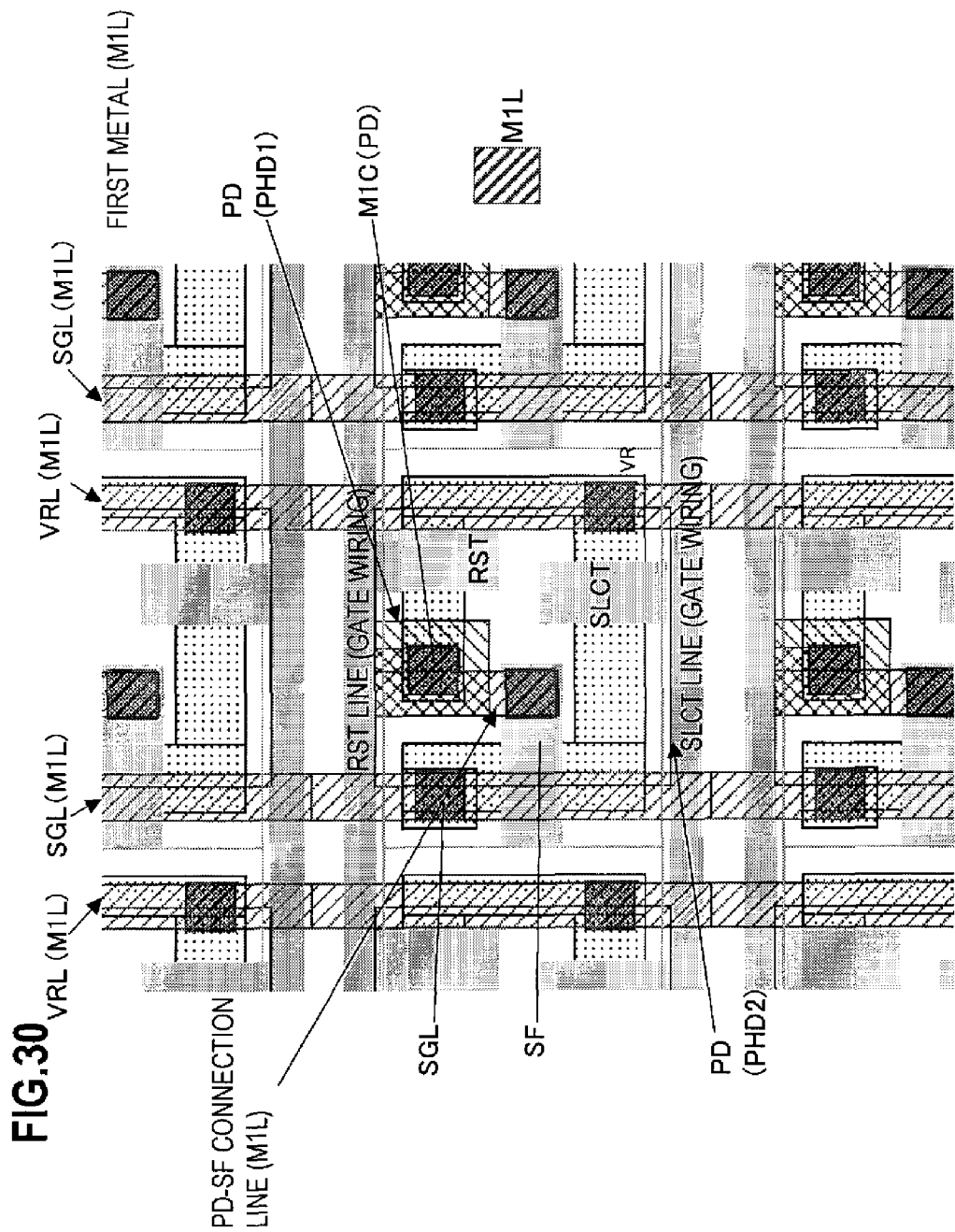
FIG. 30 is a layout diagram of pixels in the second embodiment.

The layout diagram of FIG. 30 shows a state in which the first metal wiring M1L is formed. The reset line VRL and signal line SGL extending in the vertical direction are formed by means of the first metal wiring M1L so as not to overlap with the photodiode regions PHD1 and PHD2. However, the first metal wiring PD-SF connecting the photodiode region PD and the gate electrode of the source-follower transistor SF is, as an exception, formed overlapping the photodiode regions PHD1 and PHD2, but is formed in the smallest possible area, to suppress blocking of incident light to the extent possible. The second metal wiring formed thereafter is formed so as not to overlap this photodiode region PD.

In the above, application to a three-transistor type APS has been explained as a second embodiment; however, the second photodiode region PHD2, buried overlapping transistors in the pixel, is formed below a shallow second P-type well region PW2, so that charge (electrons) resulting from photoelectric conversion in a region prior to attenuation of incident light in the silicon substrate can be captured, the effective aperture ratio can be raised, and the optical sensitivity can be improved.

INDUSTRIAL APPLICABILITY

As explained above, a CMOS image sensor enables a higher aperture ratio and improved optical sensitivity.

The invention claimed is:
1. A CMOS image sensor, comprising:
a pixel region in which are formed a plurality of pixels each having at least a photodiode, a reset transistor, and a source-follower transistor; and
a peripheral circuit region in which are formed peripheral circuits which process signals read out from the pixels, wherein
in the peripheral circuit region, within a first well region of a first conduction type at the substrate surface, a second conduction type source-drain region of transistors configuring the peripheral circuits is formed; and
in the pixel region, in a first conduction type second well region shallower than the first well region, a second conduction type source-drain region of the reset transistor and source-follower transistor is formed, and a second conduction type first photodiode region extending in the depth direction from the vicinity of the substrate surface and a second photodiode region, embedded extending from the first photodiode region to the side below the second well region in which is formed the source-drain region of the reset transistor or source-follower transistor, are formed.

2. The CMOS image sensor according to claim 1, wherein
in the peripheral circuit region, a first separation-structure which separates the peripheral circuit transistors is formed, and
in the pixel region, a second separation structure which is shallower than the first separation structure, and which separates the reset transistor and source-follower transistor, is formed, and
the second photodiode region is formed below the second separation structure.

3. The CMOS image sensor according to claim 1 or claim 2, wherein
each pixel has a transfer gate transistor connected to the photodiode,
the transfer gate transistor and the reset transistor are connected via a floating diffusion region,
the floating diffusion region is connected to a gate of the source-follower transistor,
a first conduction type shield region is formed at the substrate surface above the first photodiode region,
at least a portion of the transfer gate transistor or floating diffusion region is provided within a third well region with lower concentration than the second well region, and
a region, in which the second photodiode region is not formed, is provided below the floating diffusion region.

4. The CMOS image sensor according to claim 3, wherein, below the transfer gate transistor, the region in which the second photodiode region is not formed is provided.

5. The CMOS image sensor according to claim 1, wherein, in the peripheral circuit region, the peripheral circuit transistors have silicon gate electrodes with a metal silicide surface, and
in the pixel region, transistors above the second photodiode region have silicon gate electrodes the surface of which is not a metal silicide.

6. The CMOS image sensor according to claim 3, wherein, in the pixel region, a gate electrode of the reset transistor and a gate electrode of the transfer gate transistor, provided outside of the second photodiode region and extending in one direction, comprise silicon electrodes the surface of which is a metal silicide, and transistors above the second photodiode region have a silicon gate electrode the surface of which is not a metal silicide.

7. The CMOS image sensor according to claim 3, wherein, below the gate electrode of the transfer gate transistor, the second photodiode region is not formed below a region having a gate width to the extent that the transfer gate transistor is not normally on.

8. The CMOS image sensor according to claim 1 or claim 2, wherein
in each pixel, the first photodiode region is connected to the gate of the source-follower transistor, and
the second well region is not formed in the first photodiode region.

9. The CMOS image sensor according to claim 8, wherein the second photodiode region has a thickness and impurity concentration such that complete depletion occurs at the time of light reception, and
the first photodiode region has an area and impurity concentration such that depletion does not occur in one portion.

10. The CMOS image sensor according to claim 1, wherein
a metal wiring layer is formed on the substrate with an insulating film intervening,
a reset voltage line and signal line are formed in the metal wiring layer extending in a prescribed direction, and
the second photodiode region and metal wiring for the reset voltage line and signal line are positioned so as not to effectively overlap.

11. A method of manufacture of a CMOS image sensor having: a pixel region in which are formed a plurality of pixels each having at least a photodiode, a reset transistor, and a source-follower transistor; and a peripheral circuit region in which are formed peripheral circuits which process signals read out from the pixels, comprising:
a step of forming a first conduction type first well region having a first depth in the peripheral circuit region;
a step of forming a first conduction type second well region shallower than the first depth in the pixel region;
a step of forming a second conduction type photodiode region below the second well region in the pixel region; and
a step of forming the reset transistor or source-follower transistor within the second well region above the photodiode region.

12. The method of manufacture of a CMOS image sensor according to claim 11, further comprising:
a step of forming a first separation structure which separates peripheral circuit transistors in the peripheral circuit region; and
a step of forming a second separation structure which is shallower than the first separation structure, and which separates pixel transistors in the pixel region, wherein
in the step of forming the photodiode region, the photodiode region is formed below the second separation structure.

13. The method of manufacture of a CMOS image sensor according to claim 11, wherein
each pixel has a transfer gate transistor connected to the photodiode,
the transfer gate transistor and the reset transistor are connected via a floating diffusion region,
the floating diffusion region is connected to a gate of the source-follower transistor,
a first conduction type shield region is formed at the substrate surface above the first photodiode region,
the method further comprising a step of forming a third well region having lower concentration than the second well region in at least a portion of the region of the transfer gate transistor or floating diffusion region, and
wherein in the step of forming the photodiode region, the photodiode region is not formed below the floating diffusion region.

14. The method of manufacture of a CMOS image sensor according to claim 13, wherein in the step of forming the photodiode region, the second photodiode region is not formed below the transfer gate transistor.

* * * * *